(12) United States Patent
Mihnea et al.

(10) Patent No.: US 8,274,130 B2
(45) Date of Patent: Sep. 25, 2012

(54) PUNCH-THROUGH DIODE STEERING ELEMENT

(75) Inventors: Andrei Mihnea, San Jose, CA (US); Deepak C. Sekar, Sunnyvale, CA (US); George Samachisa, San Jose, CA (US); Roy Scheuerlein, Cupertino, CA (US); Li Xiao, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 340 days.

(21) Appl. No.: 12/582,509

(22) Filed: Oct. 20, 2009

(65) Prior Publication Data

US 2011/0089391 A1    Apr. 21, 2011

(51) Int. Cl.
*H01L 29/861* (2006.01)
(52) U.S. Cl. .. 257/497; 257/209; 257/530; 257/E27.111
(58) Field of Classification Search ............... 257/209, 257/497, 530; 365/103
See application file for complete search history.

(56) References Cited

U.S. PATENT DOCUMENTS

| | | | |
|---|---|---|---|
| 6,579,760 B1 | 6/2003 | Lung | |
| 6,753,561 B1 | 6/2004 | Rinerson et al. | |
| 7,009,694 B2 | 3/2006 | Hart et al. | |
| 7,271,081 B2 | 9/2007 | Li et al. | |
| 7,303,971 B2 | 12/2007 | Hsu et al. | |
| 2005/0121743 A1* | 6/2005 | Herner | 257/530 |
| 2006/0250837 A1 | 11/2006 | Herner et al. | |
| 2007/0015330 A1 | 1/2007 | Li et al. | |
| 2007/0015348 A1 | 1/2007 | Hsu et al. | |
| 2007/0228414 A1* | 10/2007 | Kumar et al. | 257/183 |
| 2008/0239790 A1* | 10/2008 | Herner et al. | 365/151 |
| 2010/0085794 A1* | 4/2010 | Chen et al. | 365/148 |
| 2010/0265750 A1* | 10/2010 | Yan et al. | 365/51 |
| 2011/0085370 A1* | 4/2011 | Chen et al. | 365/148 |

FOREIGN PATENT DOCUMENTS

WO    2005124787 A1    12/2005

OTHER PUBLICATIONS

International Search Report & The Written Opinion of the International Searching Authority dated Feb. 2, 2011, Patent Cooperation Treaty, PCT Application No. PCT/US2010/053128, filed Oct. 19, 2010.

King, et al., "Punchthrough Diode as the Transient Voltage Suppressor for Low-Voltage Electronics", Nov. 1, 1996, 4 pages, vol. 43, No. 11, IEEE Transactions on Electron Devices, IEEE Service Center, Pisacataway, NJ, USA.

* cited by examiner

*Primary Examiner* — A. Sefer
(74) *Attorney, Agent, or Firm* — Vierra Magen Marcus & DeNiro LLP

(57) ABSTRACT

A storage system and method for forming a storage system that uses punch-through diodes as a steering element in series with a reversible resistivity-switching element is described. The punch-through diode allows bipolar operation of a cross-point memory array. The punch-through diode may have a symmetrical non-linear current/voltage relationship. The punch-through diode has a high current at high bias for selected cells and a low leakage current at low bias for unselected cells. Therefore, it is compatible with bipolar switching in cross-point memory arrays having resistive switching elements. The punch-through diode may be a N+/P−/N+ device or a P+/N−/P+ device.

20 Claims, 23 Drawing Sheets

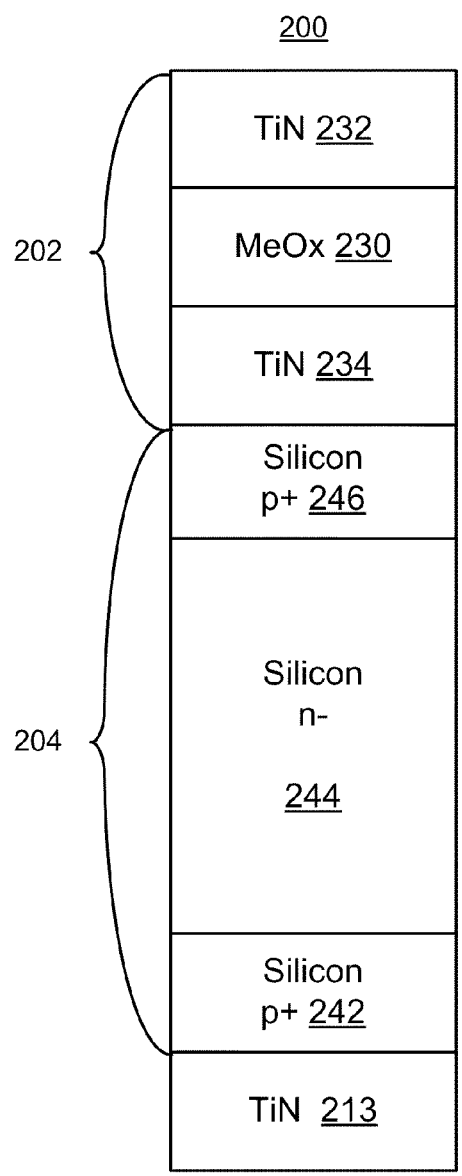
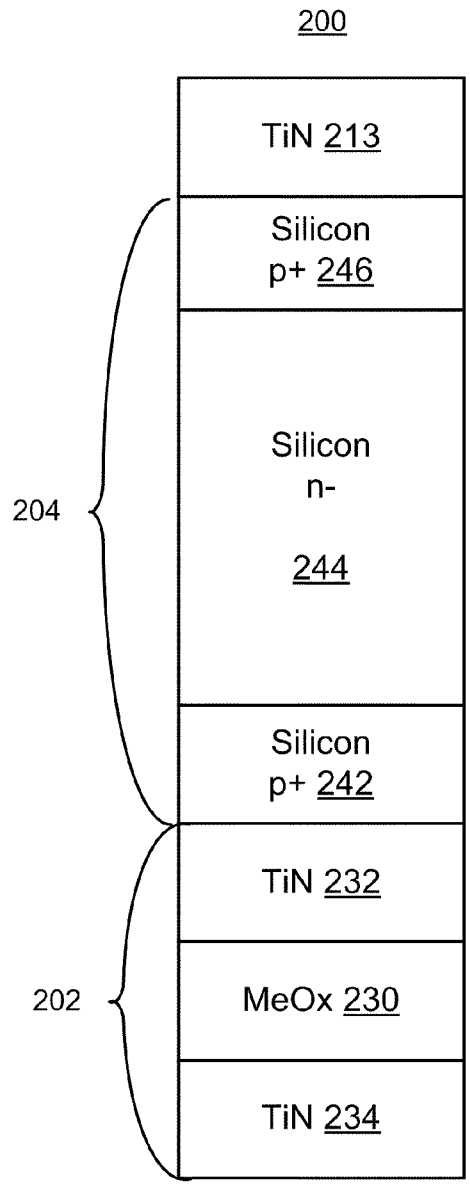
*Fig. 1C*  *Fig. 1D*

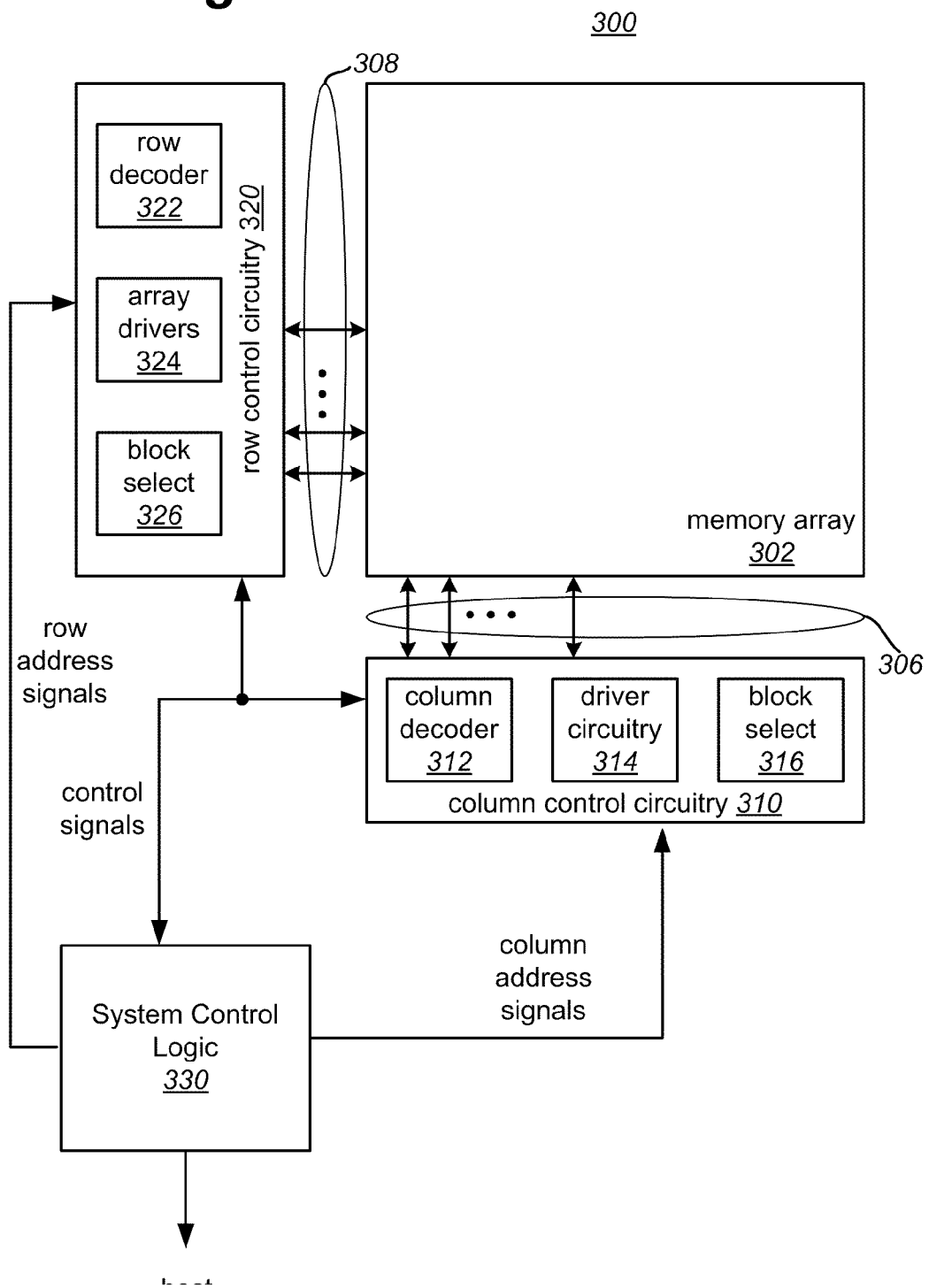

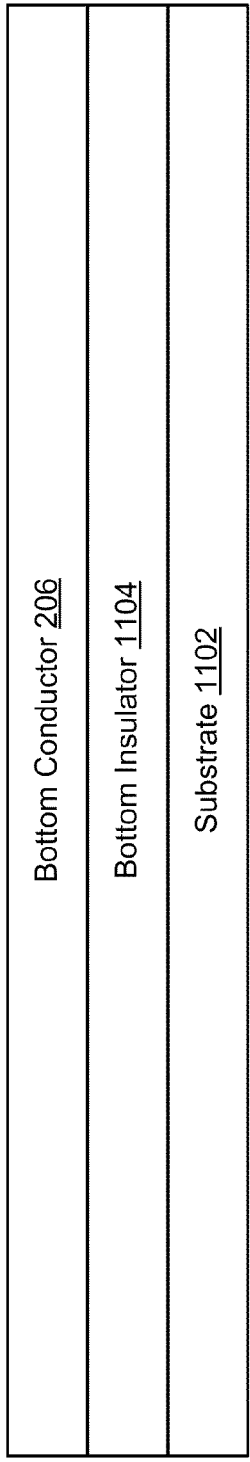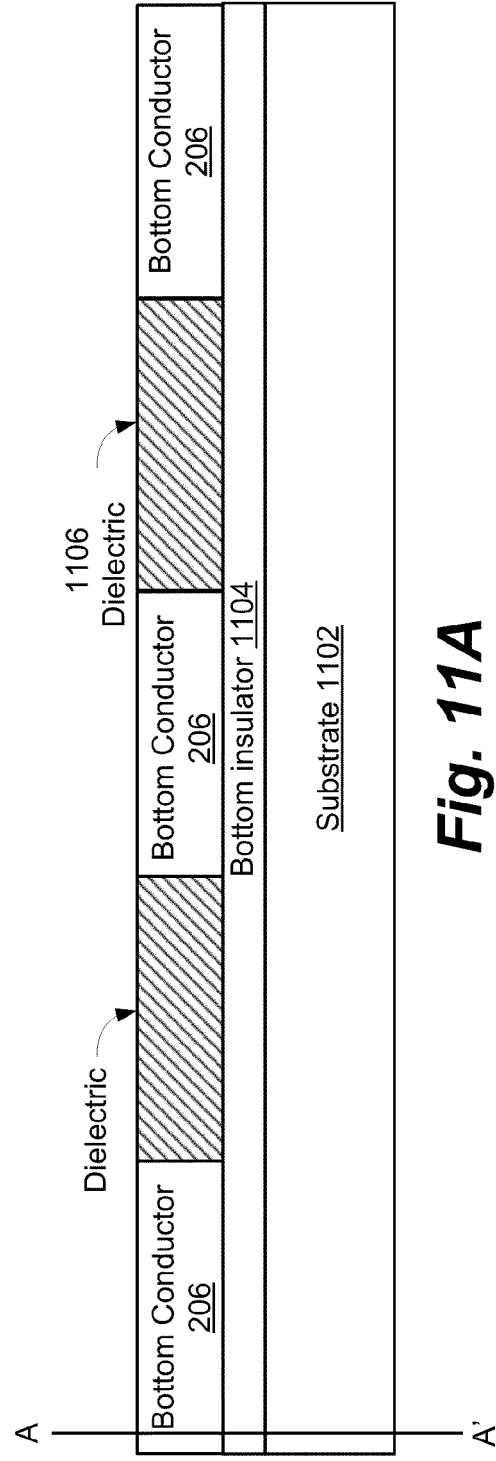
Fig. 11B
Fig. 11A

| TiN Layer | MeOx | TiN Layer | n+ Polysilicon | p- Polysilicon | n+ Polysilicon | TiN | Bottom Conductor 206 | Bottom insulator 1104 | Substrate 1102 |

Fig. 11D

PUNCH-THROUGH DIODE STEERING ELEMENT

BACKGROUND

1. Field

The present invention relates to technology for data storage.

2. Description of the Related Art

A variety of materials show reversible resistivity-switching behavior, and as such may be suitable for use as memory elements. One type of material having reversible resistivity-switching behavior is referred to as resistance change memory (ReRAM). Transition metal oxides have been proposed for ReRAM. A second type of material having reversible resistivity-switching behavior is referred to as phase change memory (PCRAM). Chalcogenides, which may change between a crystalline state (conductor) and an amorphous state (insulator), have been proposed for PCRAM. Other materials such as carbon polymers, perovskites, and nitrides have also been proposed as memory elements having reversible resistivity-switching behavior.

Upon application of sufficient voltage, current, or other stimulus, the reversible resistivity-switching material switches to a stable high-resistance state. This resistivity-switching is reversible such that subsequent application of an appropriate voltage, current, or other stimulus can serve to return the reversible resistivity-switching material to a stable low-resistance state. This conversion can be repeated many times. For some switching materials, the initial state is high-resistance rather than low-resistance.

These switching materials are of interest for use in non-volatile memory arrays. One type of memory array is referred to as a cross-point array, which is a matrix of memory elements typically arranged along x-axes (e.g., word lines) and along y-axes (e.g., bit lines). In some aspects, a digital value is stored as a memory resistance (high or low). The memory state of a memory cell can read by supplying a voltage to the word line connected to the selected memory element. The resistance or memory state can be read as an output voltage or current of the bit line connected to the selected memory cell. One resistance state may correspond to a data "0," for example, while the other resistance state corresponds to a data "1." Some switching materials may have more than two stable resistance states.

Non-volatile memories formed from reversible resistivity-switching elements are known. For example, U.S. Patent Application Publication 2006/0250836, filed May 9, 2005 and titled "REWRITEABLE MEMORY CELL COMPRISING A DIODE AND A RESISTIVITY-SWITCHING MATERIAL," which is hereby incorporated by reference herein in its entirety, describes a rewriteable non-volatile memory cell that includes a diode coupled in series with a reversible resistivity-switching material such as a metal oxide or metal nitride. Such memory cells can be programmed by applying one or more programming signals to cause the reversible resistivity-switching to change from a low resistance state to a high resistance state, which may be referred to as RESETTING the memory cell. Similarly, the memory cells can be programmed by applying one or more programming signals to cause the reversible resistivity-switching to change from the high resistance state to the low resistance state, which may be referred to as SETTING the memory cell.

Both unipolar and bipolar modes of operation of the cross-point memory arrays have been proposed. In bipolar operation, the high resistance state is established by applying a voltage having one polarity and the low resistance state is established by applying a voltage having the opposite polarity. In unipolar operation, the high resistance state and low resistance state are established by applying voltage of the same polarity.

Some memory arrays use a steering device in series with the reversible resistivity-switching element to control the current flow for SET and RESET. That is, with a cross-point memory array some memory cells are selected for programming or reading, whereas many others are unselected and therefore should not be programmed or read during the present operation. The steering element helps to control which memory cells get programmed or read during a given operation. An example of a steering element is a p-i-n diode placed in series with each reversible resistivity-switching element. With appropriate voltages applied to the bit lines and word lines, each memory element can be separately programmed and read. However, with a p-i-n diode typically only unipolar switching is possible. However, unipolar operation may suffer from problems such as requirement a high RESET current.

One proposal for bipolar operation of cross-point memory arrays is to place a metal/insulator/metal (MIM) diode in series with the resistive memory cell. However, it can be difficult to fabricate MIM diodes having desirable properties such as a sufficiently high forward bias current.

BRIEF DESCRIPTION OF THE DRAWINGS

FIGS. 1, 1A, 1B, 1C, 1D, 1E, and 1F are diagrams of embodiments of memory cells having a punch-through diode in series with a reversible resistivity-switching element.

FIG. 5 is a block diagram of one embodiment of a memory system.

FIGS. 11A and 11B depict results after the process of FIG. 10 in which bottom conductors reside over a substrate and bottom insulator with dielectric between the bottom conductors.

FIGS. 11C, 11D, 11E, and 11F depict results of forming the memory cells after various steps in the process of FIG. 12.

DETAILED DESCRIPTION

Figure 1:
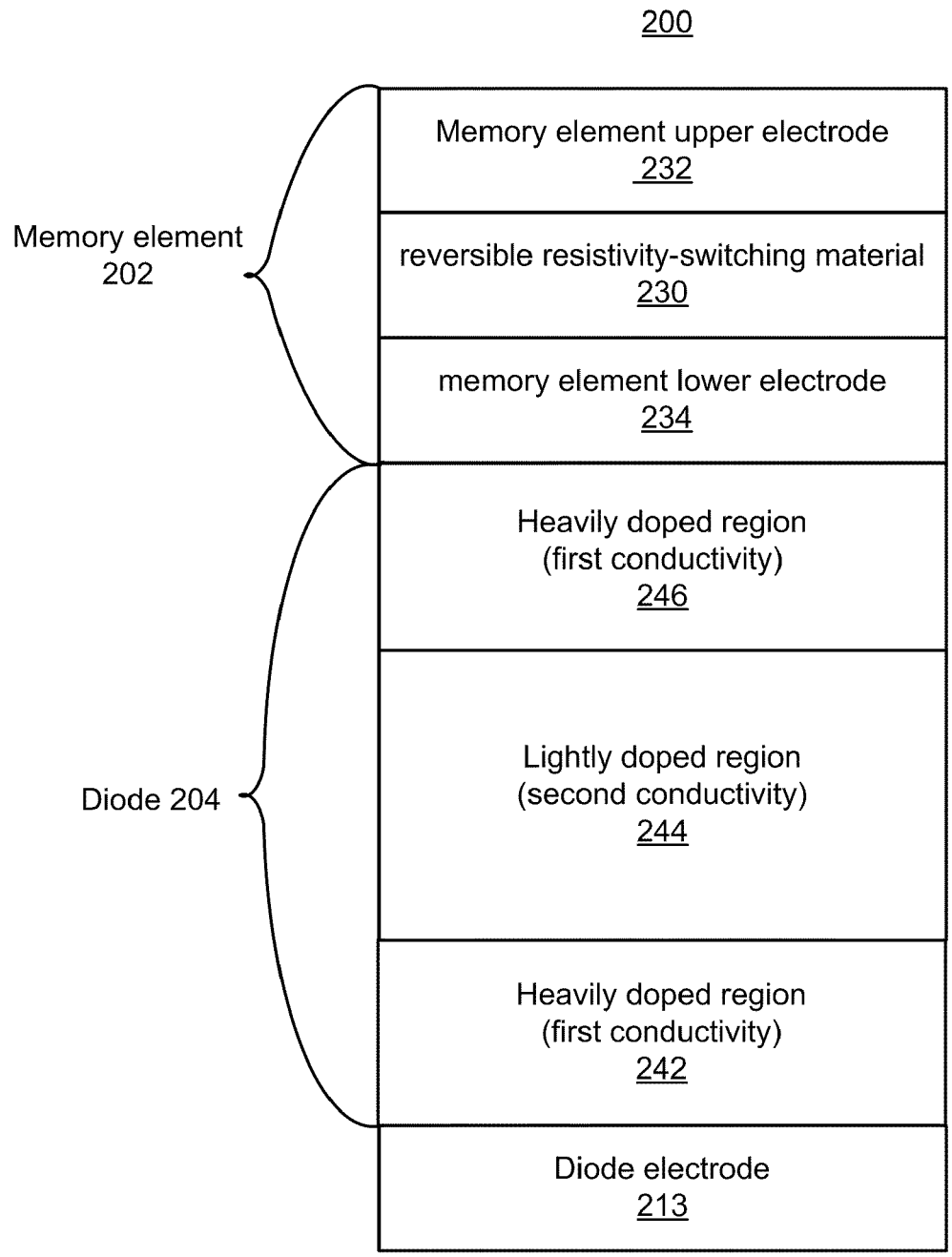

A memory system is provided that includes memory cells that have a punch-through diode as a steering element in series with a reversible resistivity-switching element. The punch-through diode allows bipolar operation of a cross-point memory array. One embodiment is a punch-through diode having a symmetrical non-linear current/voltage relationship. The punch-through diode has a high current at high bias for selected cells and a low leakage current at low bias for unselected cells. Therefore, it is compatible with bipolar switching in cross-point memory arrays having resistive switching elements. The punch-through diode may be a N+/P−/N+ device or a P+/N−/P+ device FIGS. 1-1F depict embodiments of memory cells 200 having punch-through diodes 204 in series with reversible resistivity-switching elements 202. In this manner, the memory cell 200 may be used as part of a two or three dimensional memory array and data may be written to and/or read from the memory cell 200 without affecting the state of other memory cells in the array.

In FIG. 1, punch-through diode 204 includes two regions 242, 246 that are heavily-doped with a material having a first type of conductivity. The diode 204 has a region 244 that is lightly-doped with a material having a second type of conductivity between regions 242 and 246. For example, the punch-through diode 202 may be a N+/P−/N+ device or a P+/N−/P+ device. As one example, the thicknesses of the diode regions may be as follows: heavily-doped region 242: 50 nanometers (nm), lightly-doped region 244: 70 nm, heavily-doped region 246: 50 nm. As another example, the thicknesses of the diode regions may be as follows: heavily-doped region 242: 40 nanometers (nm), region 244: 90 nm, heavily-doped region 246: 40 nm. In some embodiments heavily-doped regions 242 and 246 have the same thickness, although that is not required. In some embodiments, lightly-doped region 244 is thicker than each individual heavily-doped region 242, 246, although that is not required. An example width for the punch-through diode 204 is 43 nm. However, the punch-through diode 204 may have a greater or smaller width.

In some embodiments, punch-through diode 204 may be formed from a polycrystalline semiconductor material such as polysilicon, germanium, or another semiconductor. Also, the punch-through diode 204 may comprise more than one type of semiconductor. For example, punch-through diode 204 may be formed from a polycrystalline silicon-germanium alloy, polygermanium or any other suitable combination of semiconductors. In some embodiments, each region 242, 244, 246 of the punch-through diode 204 is formed from the same material (but doped differently). However, it is not required that each region be formed from the same material. For example, a heterostructure may be possible.

The memory cell 200 has a memory element 202 that includes a reversible resistivity-switching material 230, an upper electrode 232, and a lower electrode 234. In one embodiment, the reversible resistivity-switching material 230 is a metal-oxide. In one embodiment, the memory cell electrodes 232, 234 are formed from TiN. The memory cell 200 has a diode electrode 213 at the bottom of the memory cell 200 to facilitate electrical contact between the diode 204 and other circuit elements. In one embodiment, the diode electrode 213 is formed from TiN. Note that the relative positions of the diode 204 and the memory element 202 could be reversed. For example, the diode 204 could be above the memory element 202.

Figure 1A:
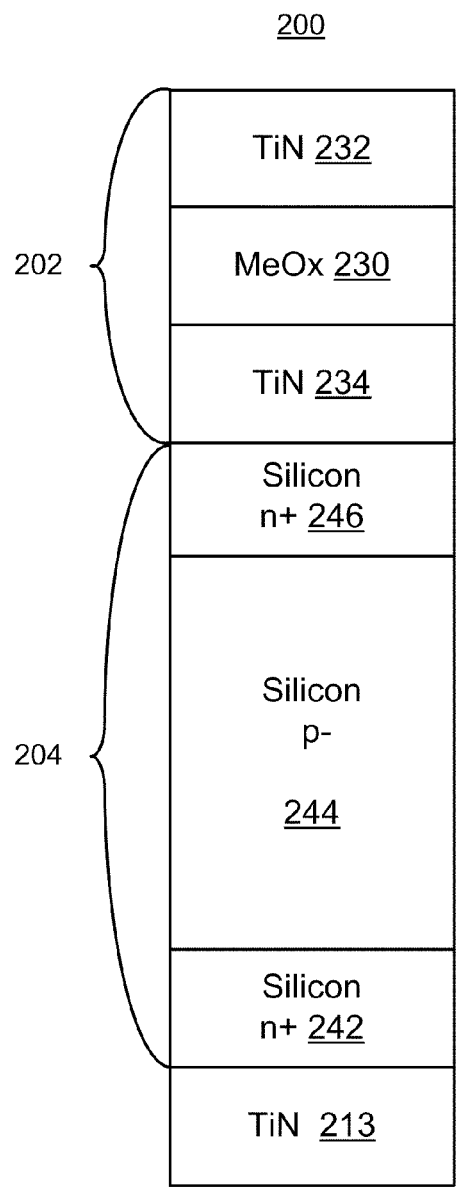
Figure 1B:
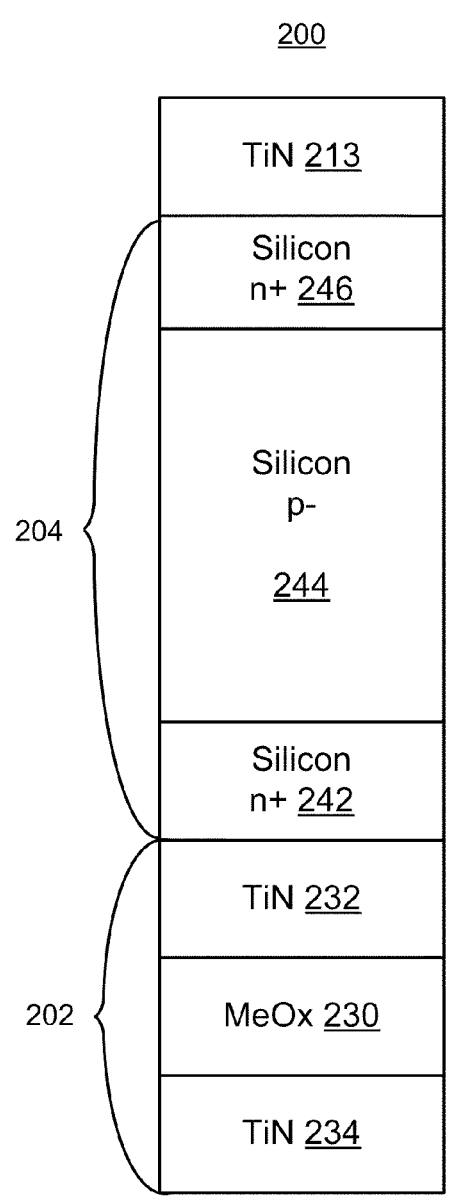
Figure 1E:
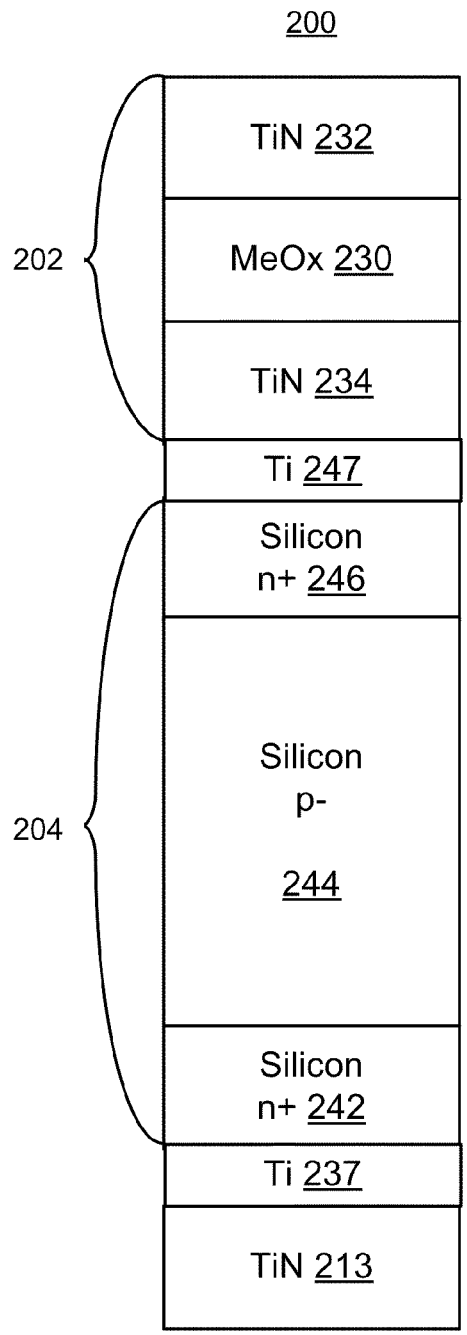
Figure 1F:
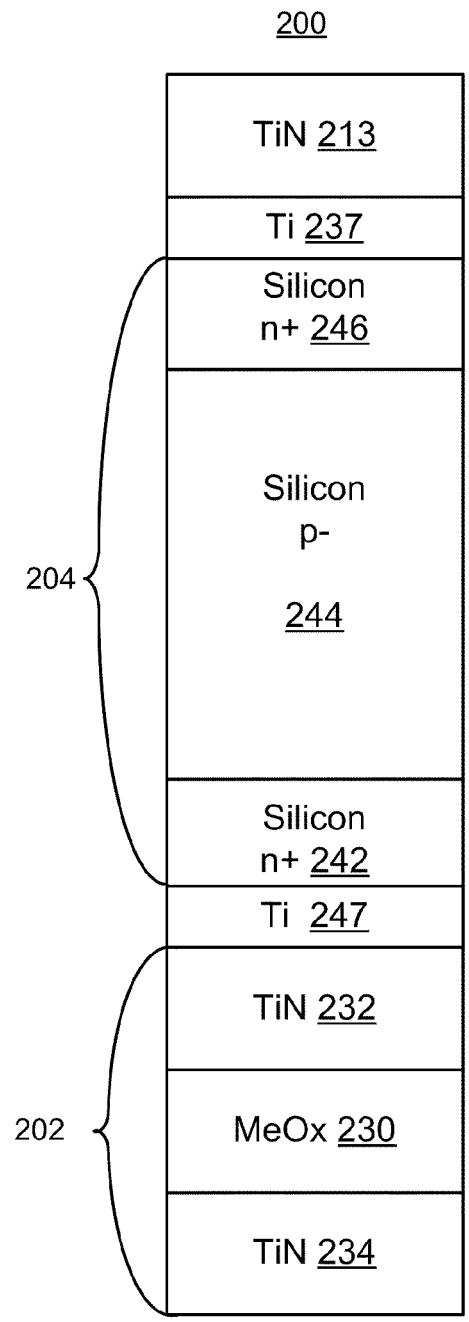

FIGS. 1A-1F depicts several examples of memory cells 200 having punch-through diodes 204 in series with memory elements 202. In FIG. 1A, the punch-through diode 204 is an N+/P−/N+ device formed from silicon. The memory cell 200 has a reversible resistivity-switching material 230 formed from metal-oxide (MeOx) and electrodes formed from TiN. The lower electrode 213 is formed from TiN. FIG. 1B is a variation in which the punch-through diode 204 is above the memory cell 202. In this example, there is a diode electrode 213 above the punch-through diode 204 to facilitate contact to other circuit elements.

As previously mentioned, the punch-through diode 204 can be an N+/P−/N+ device or a P+/N−/P+ device. FIG. 1C depicts an embodiment of a memory cell 200 in which the diode 204 is a P+/N−/P+ device. In FIG. 1C, the punch-through diode 204 is below the memory element 202. FIG. 1D depicts an embodiment of a memory cell 200 in which the punch-through diode 204 is a P+/N−/P+ device and is above the memory element 202.

The punch-through diode 204 may have additional layers than those depicted in FIGS. 1, 1A, 1B, 1C, and 1D. In one embodiment, to reduce the electrical resistance between the punch-through diode 204 and other elements a layer of material is added to form a silicide. FIGS. 1E and 1F depict embodiments in which a titanium layer is used to form a silicide with a portion of the punch-through diode 204.

In FIG. 1E, a first titanium layer 237 resides between the diode electrode 213 and the n+ region 242 of the punch-through diode 204. A second titanium layer 247 resides between the n+ region 246 and the bottom electrode 234 of the memory element 202. Note that the diode 204 could be a P+/N−/P+diode instead. When forming the diode 204, the diode may be subjected to a thermal anneal such that the silicide forming material reacts with the semiconductor material of the diode 204. For example, the titanium regions 237, 247 may react with silicon in heavily-doped regions 242, 246 to form titanium-silicide. Note that titanium is one example of a "silicide forming material." Other silicide forming materials could be used in regions 237 and 247.

In FIG. 1F, a first titanium layer 237 resides between the diode electrode 213 and heavily-doped region 246. A second titanium layer 247 resides between heavily-doped region 242 and the upper electrode 232 of memory element 202. Note that the diode 204 could be a P+/N−/P+ diode instead. When forming the diode 204, the diode may be subjected to a thermal anneal such that the silicide forming material reacts with the semiconductor material of the diode.

Another possible variation to the punch-through diode 204 is to add a thin layer between the heavily doped region 242 and the lightly doped region 244 to prevent migration of the dopant from the heavily doped region 242 to the lightly doped region 244. In one embodiment, a thin (e.g., a few hundred angstroms or less) germanium and/or silicon-germanium alloy layer, with about 10% or more of germanium when using a silicon-germanium alloy layer, is formed between the heavily doped region 242 and the lightly doped region 244 to prevent and/or reduce dopant migration from the heavily doped region 242 into the lightly doped region 244.

Figure 2A:
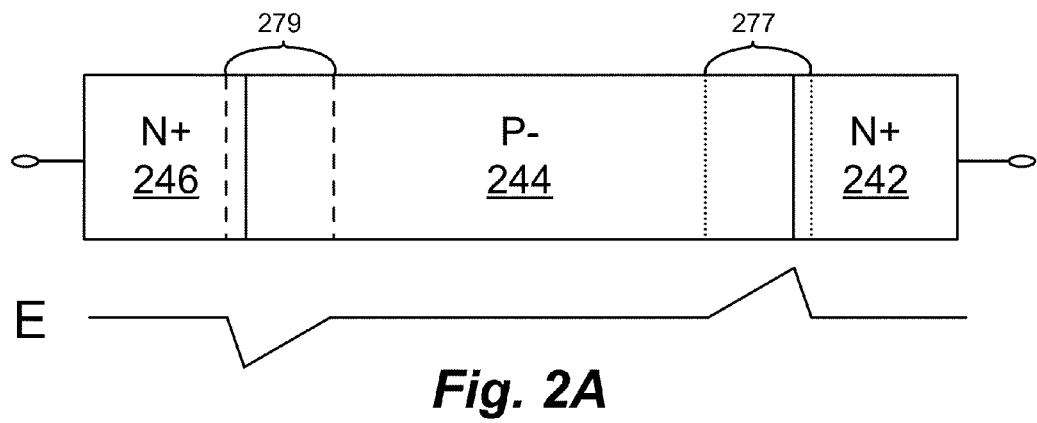
FIG. 2A is a diagram showing the electric field and space charge region in one embodiment of a punch-through diode under no bias.

A punch-through diode 204 may be considered to be a back-to-back (anti-serial) connection of two p-n-diodes. Under high bias conditions, the space charge regions of the two junctions can merge (punch-through), such that current flow is enabled at voltages beyond the breakdown voltage (punch-through-voltage). FIG. 2A is a diagram of space charge regions and electric fields in one embodiment of a punch-through diode 204 under equilibrium conditions without an external voltage applied to the diode 204.

For the sake of discussion, an example in which the diode 204 is an N+/P−/N+ device will be used. It will be understood that the operation of a P+/N−/P+ punch-through diode 204 is similar. Electrons from N+ region 242 diffuse into p− region 244 and holes diffuse from the p− region 244 into the n+ region 242 forming space charge region 277. Similarly, electrons from N+ region 246 diffuse into p− region 244 and holes diffuse from the p-region 244 into the n+ region 246 forming space charge (or depletion) region 279. The electric field (E) that is created by the space charge regions 277, 279 is depicted below the diode 204. It will be understood that the boundaries of the depletion regions 277, 279 of the punch-through diode 204 are not necessarily distinct or regular, and thus the dotted lines are merely representative of the boundaries for illustrative purposes.

Figure 2B:
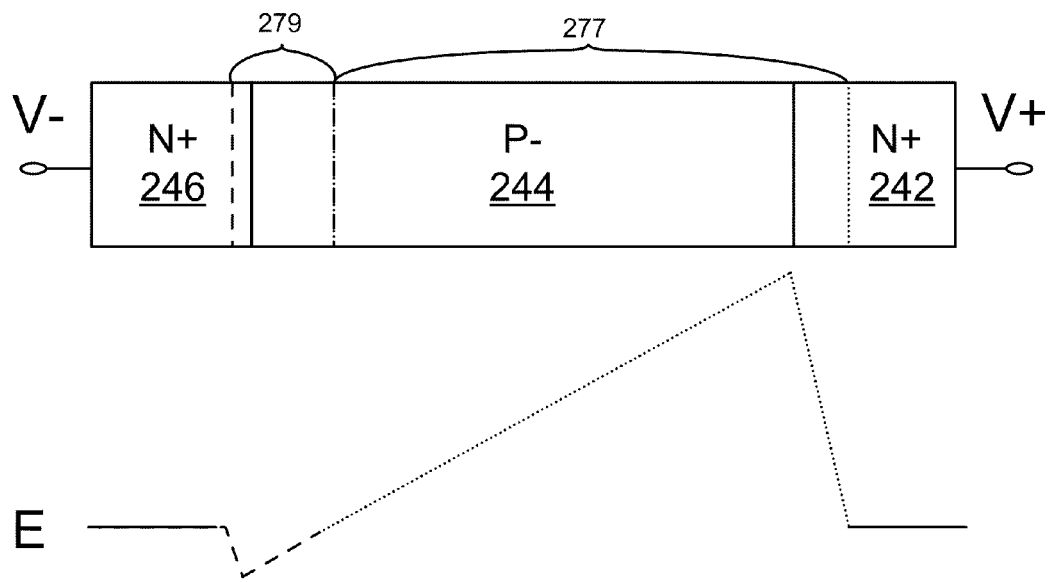
FIG. 2B is a diagram showing the electric field and space charge region in one embodiment of a punch-through diode under a voltage bias.

If a positive potential is applied to N+ region 242 (relative to N+ region 246), the junction between N+ region 242 and P− region 244 will be reverse biased. Also, the junction between N+ region 246 and P− region 244 will remain essentially in equilibrium. As the magnitude of the applied voltage is increased, the size of the depletion region 277 of the reverse biased junction increases. Eventually, the depletion region 277 of reverse biased junction meets the depletion region of the other junction, which is unbiased. FIG. 2B depicts this "punch-through" condition and the electric field (E). Specifically, depletion region 277 of the reverse biased junction has expanded and now reaches the depletion region 279 of the other junction. The bias voltage necessary for this punch-through condition may be referred to as the "punch-through voltage." At this voltage, a voltage barrier exists in the unbiased junction of a magnitude sufficient to prevent all but a small amount of current flow through the diode 204. If the applied voltage is increased only slightly beyond the punch-through voltage, the current increases substantially.

Note that instead of applying a positive voltage to N+ region 242, a positive voltage could be applied to N+ region 246 (relative to N+ region 242). If this is done such that the voltage applied across the diode 204 is reversed in polarity, then the junction between N+ region 246 and p− region 244 will be reverse biased and the other junction will be unbiased. In this case, increasing the magnitude of the applied voltage causes space charge region 279 to grow towards space charge region 277. Punch-through conduction occurs when a negative punch-through voltage is reached. In some embodiments, the negative punch-through voltage is the same magnitude, but opposite polarity as the positive punch-through voltage.

The slope of the electric field of a p-n junction is proportional to the doping at the p-n junction. Thus, the slope of the electric field in the lightly-doped region 244 is much less than the slope of the electric field in the heavily-doped regions 242, 246. In one embodiment, the heavily-doped regions 242, 246 have a doping concentration of about $1.0 \times 10^{21}/cm^3$ and the lightly-doped region 244 has a doping concentration of about $7.0 \times 10^{17}/cm^3$. However, the doping concentration in the heavily-doped regions 242, 246 may be greater or less than $1.0 \times 10^{21}/cm^3$ and the doping concentration in the lightly-doped region 244 may be greater or less than $7.0 \times 10^{17}/cm^3$. In one embodiment, the doping concentration in the heavily-doped regions 242, 246 is about 1000 times the doping concentration in the lightly-doped region 244. However, the doping concentration in the heavily-doped regions 242, 246 could be more or less than 1000 times the doping concentration in the lightly-doped region 244.

Note that the doping concentration is not necessarily uniform throughout a given region 242, 244, 246. In some embodiments, the doping concentration is graded in the heavily-doped regions 242, 246. In some embodiments with a graded doping profile, the doping concentration in the heavily-doped regions 242 246 is lowest near the lightly-doped region 244. For example, the doping concentration in the heavily-doped regions 242, 246 near the interface with the lightly-doped region 244 may be about $1.0 \times 10^{18}/cm^3$ gradually increasing to about $1.0 \times 10^{21}/cm^3$ in a direction away from the lightly-doped region 244. In one embodiment, the doping concentration in the heavily-doped regions 242 246 is graded, but the doping concentration in the lightly-doped region 244 is substantially uniform. However, the doping concentration in the lightly-doped region 244 may be graded.

Figure 3:
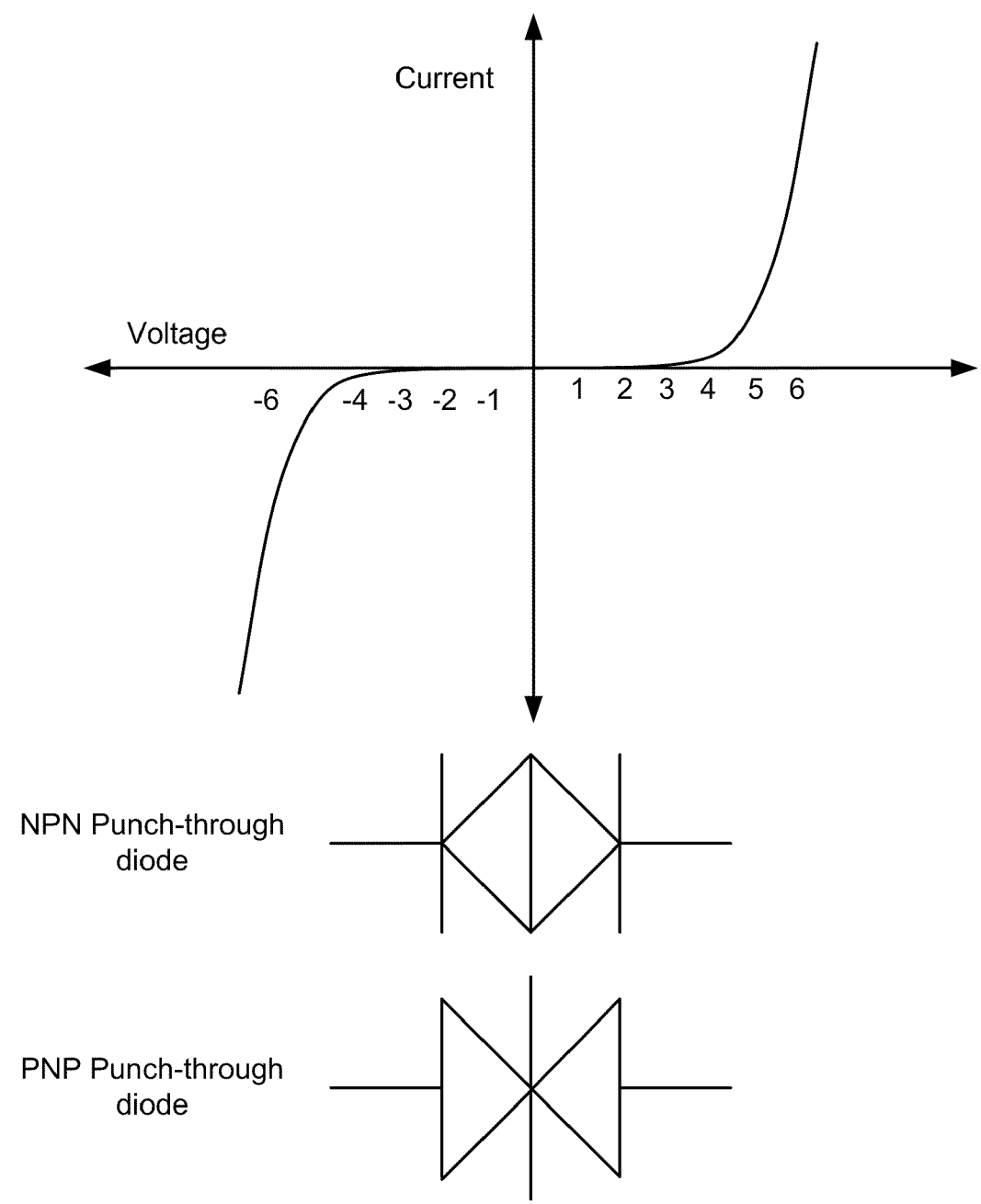
FIG. 3 is a graph showing a current-voltage relationship of one embodiment of a punch-through diode.

FIG. 3 depicts a current-voltage relationship of one embodiment of a punch-through diode 204 and circuit symbols for NPN and PNP punch-through diodes. In this embodiment, the I-V curve is symmetrical about the origin, which makes it suitable for use in bipolar operation of a cross point array. Note that the I-V curve does not need to be perfectly symmetrical. Moreover, a symmetrical I-V curve is not an absolute requirement. The punch-through diode 204 exhibits a sharply rising conduction upon application of a voltage due to punch-through conduction. Unlike a conventional p-n junction diode, which may have a turn on voltage of about 0.6 or 0.7 volts, punch-through diodes 204 may have a higher turn on voltage. For example, the turn on voltage may be above 2.0 volts, or even higher. However, there are no specific requirements as to the turn on voltage.

Memory Cell and System

Figure 4A:
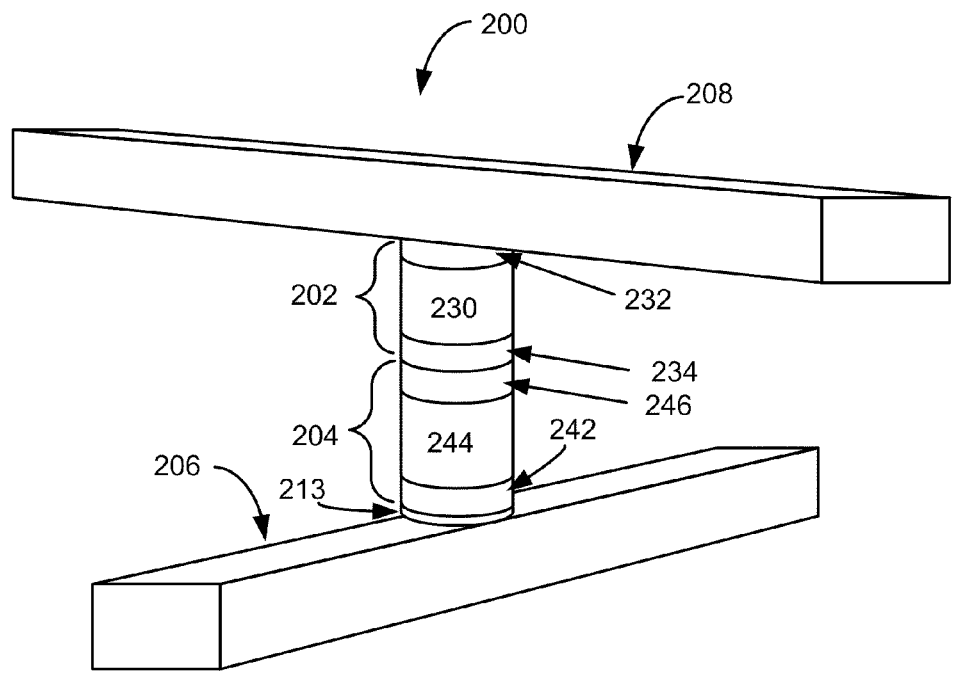
FIG. 4A is a simplified perspective view of one embodiment of a memory cell with a punch-through diode as a steering element.

FIG. 4A is a simplified perspective view of one embodiment of a memory cell 200 which includes a reversible resistivity-switching element 202 coupled in series with a steering element 204 between a first conductor 206 and a second conductor 208. Any of the example punch-through diodes 204 described herein may be used for the steering element 204. It will be understood that the punch-through diodes 204 described herein are for purposes of illustration. Therefore, the steering element 204 is not limited to the example punch-through diodes 204 described herein.

Reversible resistivity-switching element 202 includes reversible resistivity-switching material 230 having a resistance that may be reversibly switched between two or more states. For example, the reversible resistivity-switching material may be in an initial high-resistance state upon fabrication that is switchable to a low-resistance state upon application of a first physical signal. For example, the device may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used. Numerous reversible resistivity-switching materials and operation of memory cells employing reversible resistivity-switching materials are described, for example, in U.S. Patent Application Publication 2006/0250836, previously incorporated.

In one embodiment, the process of switching the resistance from the high-resistance state to the low-resistance state is referred to as SETTING the reversible resistivity-switching element 202. The process of switching the resistance from the low-resistance state to the high-resistance state is referred to as RESETTING the reversible resistivity-switching element 202. The high-resistance state may be associated with binary data "0" and the low-resistance state is associated with binary data "1." In other embodiments, SETTING and RESETTING and/or the data encoding can be reversed.

In some embodiments, reversible resistivity-switching material 230 may be formed from a metal oxide. Various different metal oxides can be used. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety.

Reversible resistivity-switching element 202 includes electrodes 232 and 234. Electrode 232 is positioned between reversible resistivity-switching material 230 and conductor 208. In one embodiment, electrode 232 is made of TiN. Electrode 234 is positioned between reversible resistivity-switching material 230 and diode 204. In one embodiment, electrode 234 is made of Titanium Nitride, and serves as a barrier layer.

Conductors 206 and 208 may include any suitable conductive material such as tungsten, any appropriate metal, heavily-doped semiconductor material, a conductive silicide, a conductive silicide-germanide, a conductive germanide, or the like. In the embodiment of FIG. 4A, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

While the reversible resistivity-switching element 202 is shown as being positioned above the punch-through diode steering element 204 in FIG. 4A, it will be understood that in alternative embodiments, the reversible resistivity-switching element 202 may be positioned below the punch-through diode steering element 204.

Figure 4B:
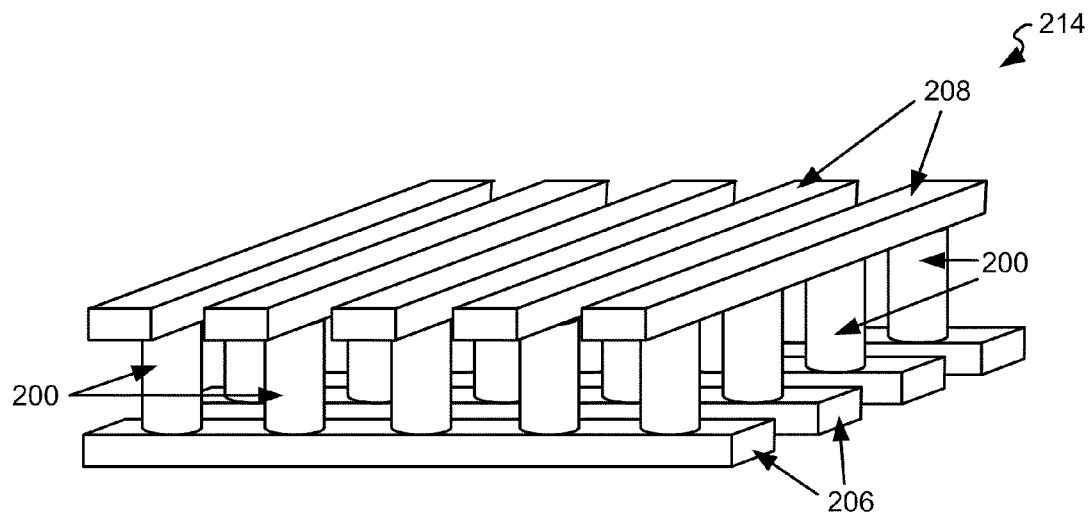
FIG. 4B is a simplified perspective view of a portion of a first memory level formed from a plurality of the memory cells of any of FIGS. 1, 1A, 1B, 1C, 1D, 1E, and 1F.

FIG. 4B is a simplified perspective view of a portion of a first memory level 214 formed from a plurality of the memory cells 200 of FIG. 4A. For simplicity, the reversible resistivity-switching element 202 and the punch-through diode steering element 204 are not separately shown. The memory array 214 is a "cross-point" array including a plurality of first conductors 206 (e.g., bit lines) and a plurality of second conductors 208 (e.g., word lines) between which multiple memory cells are coupled (as shown). Other memory array configurations may be used, as may multiple levels of memory.

Figure 4C:
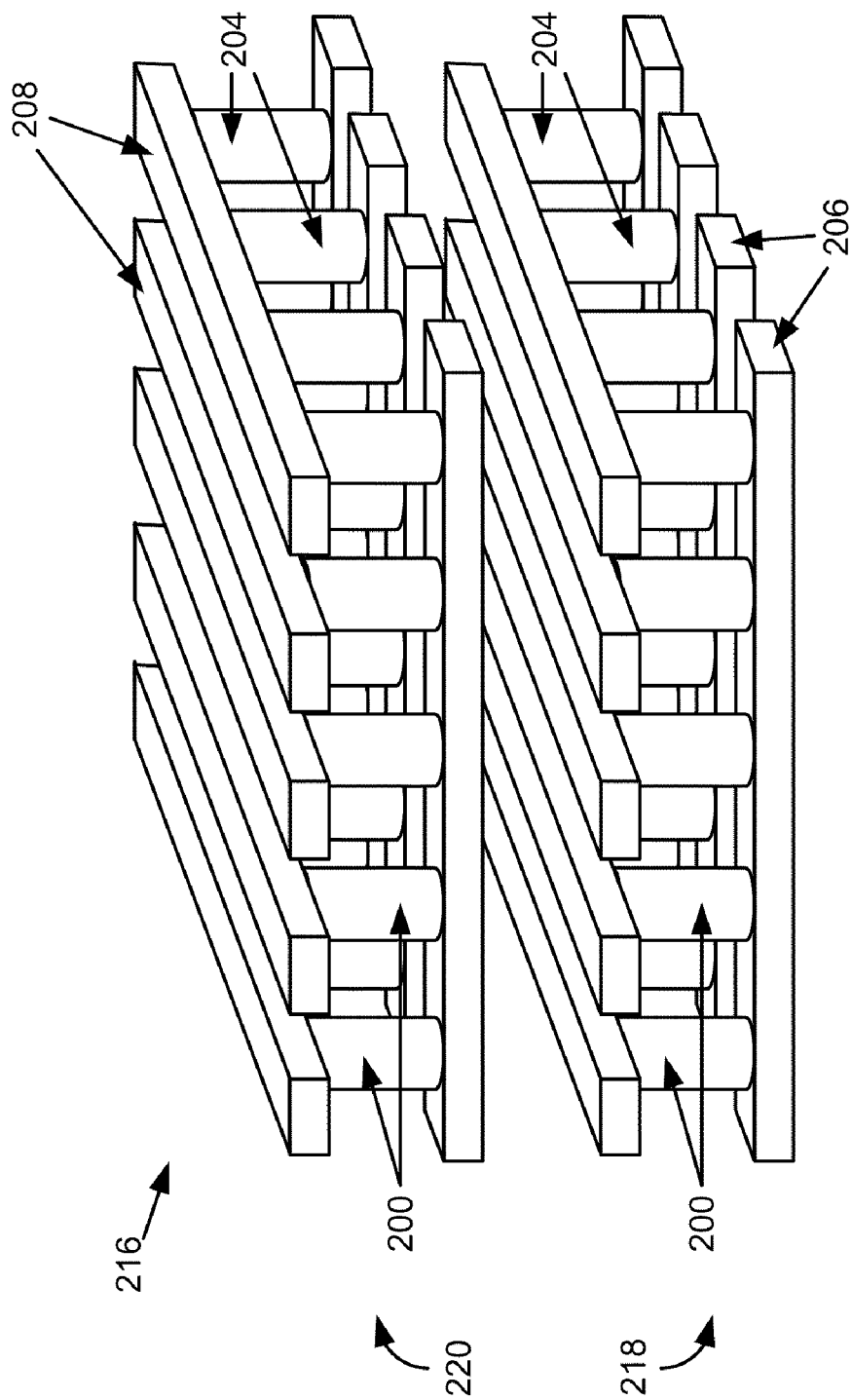
FIG. 4C is a simplified perspective view of a portion of a three dimensional memory array.

FIG. 4C is a simplified perspective view of a portion of a monolithic three dimensional array 216 that includes a first memory level 218 positioned below a second memory level 220. In the embodiment of FIG. 4C, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4C for simplicity. Other memory array configurations may be used, as may additional levels of memory.

Figure 4D:
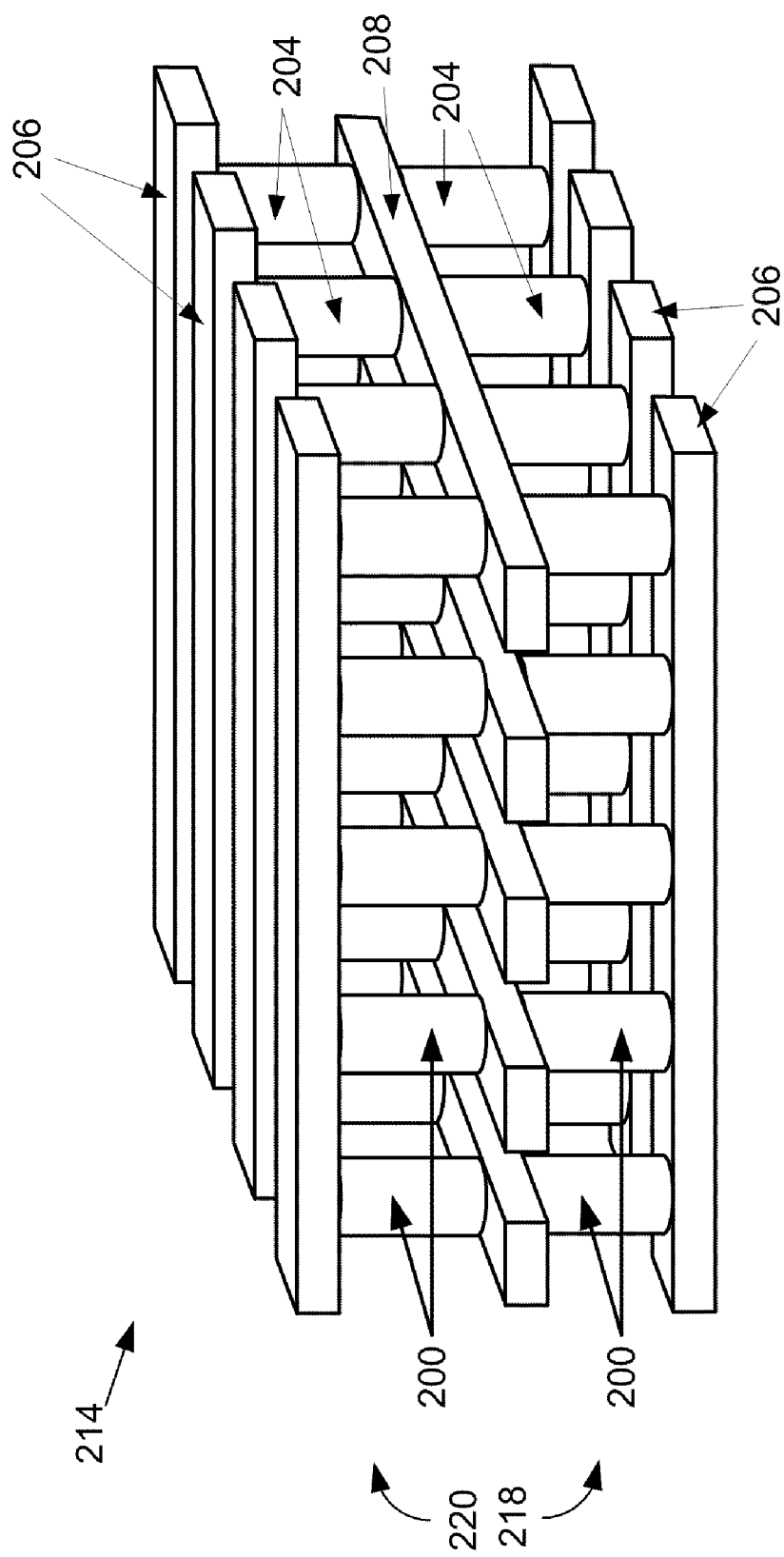
FIG. 4D is a simplified perspective view of a portion of a three dimensional memory array.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 4D.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 4A-4D show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. Nos. 6,952,043; 6,951,780; 6,034,882; 6,420,215; 6,525,953; and 7,081,377.

FIG. 5 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

Integrated circuits incorporating a memory array usually subdivide the array into a number of sub-arrays or blocks. Blocks can be further grouped together into bays that contain, for example, 16, 32, or a different number of blocks. Each block in a 3-D memory may have many layers of memory cells. For example, a block might include 8 layers. Each layer may include hundreds, or thousands of bit lines and word lines. For example, a layer might have about a thousand bit lines and about 8 thousand word lines. In some implementations, there is a bit line driver associated with each bit line. Note that a given driver could be shared between two or more bit lines. Also note that it is not required that a given bit line have only one driver associated therewith. In some implementations, some of the drivers are physically located on one side of the memory array and other drivers on the opposite side of the memory array.

As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

In one embodiment, all of the components depicted in FIG. 5 are arranged on a single integrated circuit. For example, system control logic 330, column control circuitry 310, and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array 302.

As described above, reversible resistivity-switching element 202 may be reversibly switched between two or more states. For example, the reversible resistivity-switching material may be in an initial, high-resistance state upon fabrication that is switchable to a low-resistance state upon application of a first amount of energy, charge, heat, voltage and/or current. Application of a second amount of energy, charge, heat, voltage and/or current may return the reversible resistivity-switching material to a high-resistance state.

Figure 6:
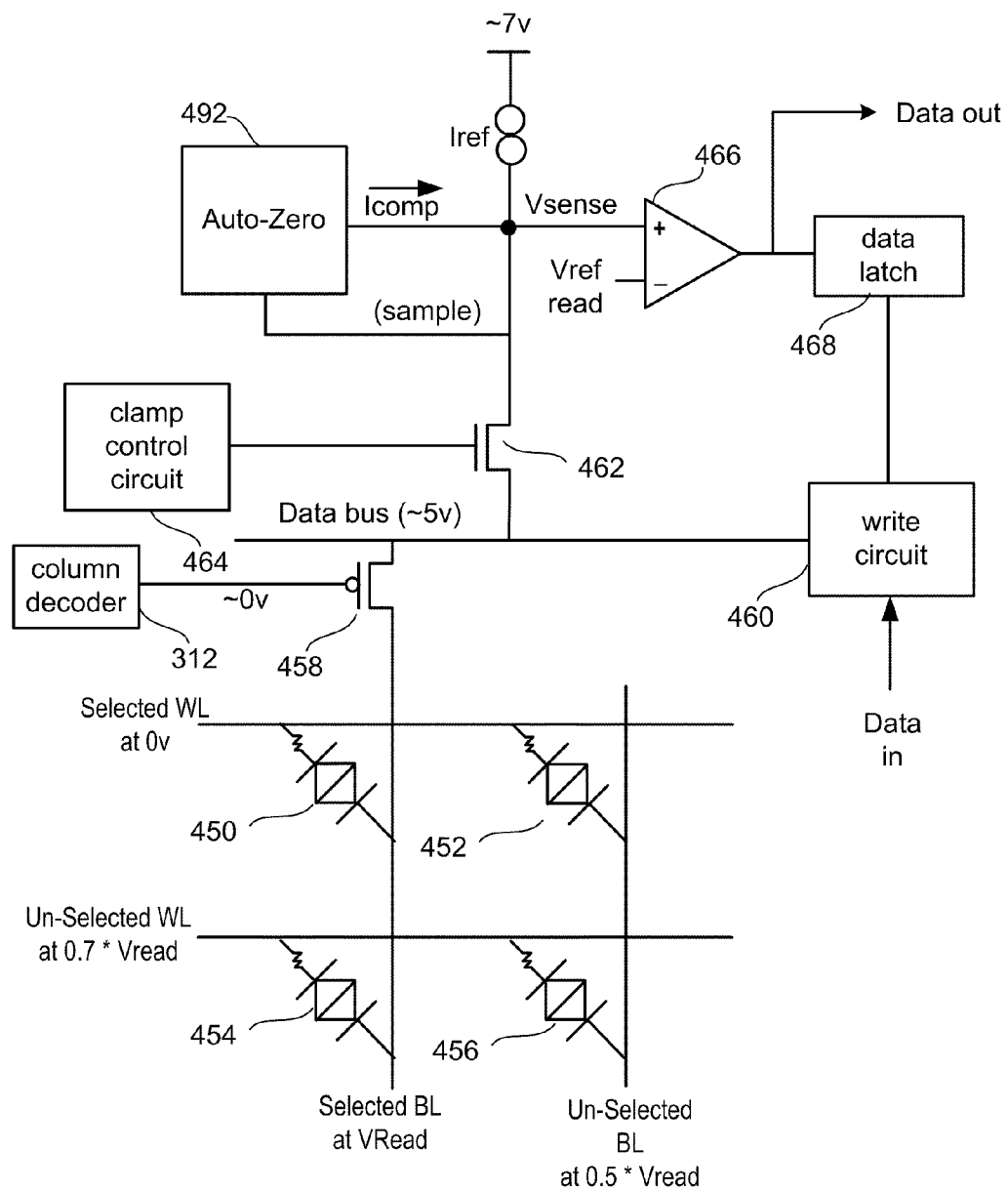
FIG. 6 depicts a circuit that can read the state of a memory cell.

FIG. 6 depicts a circuit that illustrates one embodiment for reading the state of a memory cell. FIG. 6 shows a portion of a memory array including memory cells 450, 452, 454 and 456, which may be based on the embodiments of FIGS. 1, 1A, 1B, 1C, 1D, 1E, 1F, 4A, 4B, 4C, and 4D. In FIG. 6, the diode steering elements of the memory cells are depicted as NPN punch-through diodes. However, PNP punch-through diodes could be used. Two of the many bit lines and two of the many word lines are depicted. A read circuit for one of the bit lines is depicted to be connected to the bit line via transistor 458, which is controlled by a gate voltage supplied by column decoder 312 in order to select or unselect the corresponding bit line. Transistor 458 connects the bit line to a Data bus. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to comparator 466 and reference current supply $I_{REF}$. The output of comparator 466 is connected to a data out terminal (to system control logic 330, a controller and/or a host) and to data latch 468. Write circuit 460 is also connected to data latch 468.

The circuit of FIG. 6 has an auto-zero mechanism 492 that compensates for current from non-selected memory elements during a read of a selected memory element. The auto-zero mechanism 492 is connected to the Vsense node and operates to sample and hold a physical condition (e.g., charge) that represents the current from non-selected memory elements. The sample and hold may be performed prior to reading a selected memory cell. When reading a selected memory cell, the auto-zero mechanism 492 outputs a current, Icomp, to compensate for the current from the non-selected memory elements on the selected bit line.

During the auto-zero operation all word lines (WL) are at an unselected voltage about 70% of a Vread that is applied to the data bus. The bit line current from all cells on the selected bit line (BL) flows through clamp device 462 and pulls down Vsense until an equilibrium voltage is reached on Vsense. During the data sensing operation the auto-zero mechanism 492 outputs $I_{COMP}$, which supplies the current that flowed during auto-zero operation and therefore compensates for current from non-selected memory elements. Further details of the auto-zero mechanism 492 are discussed below in connection with the example read process of FIG. 8 and in the example circuit of FIG. 13. Note that the auto-zero mechanism 492 is not a requirement.

Basic data sensing operation of FIG. 6 will now be discussed. When attempting to read the state of the reversible resistivity-switching element, all word lines (WL) are first biased at Vread (e.g., approximately 5 volts) and all bit lines are biased at an un-selected BL voltage of 0.5 times Vread. The selected word line (WL) is then pulled to ground. For example purposes, this discussion will assume that memory cell 450 is selected for reading. One or more selected bit lines (BL) are pulled to Vread through the data bus (by turning on transistor 458) and the clamp device (transistor 462, which receives ~5 volts+Vt). The clamp device's gate is above Vread but controlled to keep the selected bit line (BL) near Vread. During the data sensing operation the sample and hold circuit 467 does not sample Vsense. In an auto-zero embodiment, auto-zero mechanism 492 outputs $I_{COMP}$ which supplies the current that flowed during auto-zero operation and therefore compensates for current from non-selected memory elements. Current is pulled by the selected memory cell through transistor 462 from the $V_{SENSE}$ node. The $V_{SENSE}$ node also receives a reference current $I_{REF}$ that is between a high-resistance state current and a low-resistance state current. In the auto-zero embodiment, the Vsense node also receives Icomp. The $V_{SENSE}$ node moves corresponding to the current difference between the cell current and the reference current $I_{REF}$. Comparator 466 generates a data out signal by comparing the $V_{SENSE}$ voltage to a Vref-read voltage. If the memory cell current is larger than $I_{REF}$, the memory cell is in the low-resistance state and the voltage at $V_{SENSE}$ will be lower than $V_{REF}$. If the memory cell current is smaller than $I_{REF}$, the memory cell is in the high-resistance state and the voltage at $V_{SENSE}$ will be higher than $V_{REF}$. The data out signal from comparator 466 is latched in data latch 468. In some embodiments, the reference current is based on the address of the memory cell.

Figure 7A:
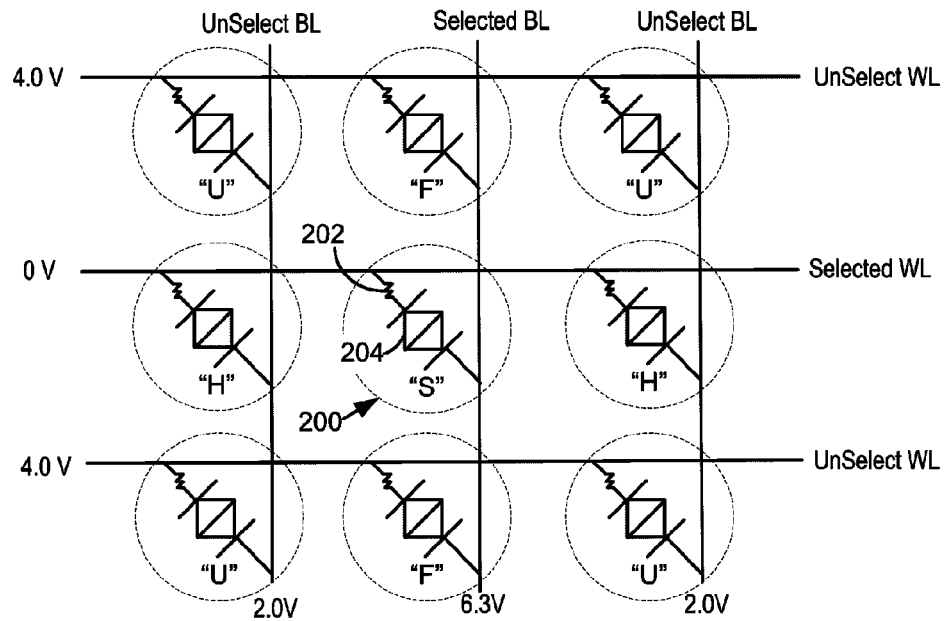
FIG. 7A depicts one embodiment of an array biasing scheme for programming memory cells.

FIG. 7A depicts one embodiment of an array biasing scheme for programming memory cells 200 that have reversible resistivity switching element 202 and a punch-through diode 204 as a steering element. In this biasing scheme, 6.3 V is applied to the selected bit line (BL) while the selected word line (WL) is grounded, resulting in about 6.3 V across the selected memory cell (identified as "S" in FIG. 7A). Note that there may be some voltage drop across the selected bit line and the selected word line; however, to simplify the discussion these effects will be ignored. Unselected word lines each have 4.0 V applied thereto. This results in about 2.3 V across unselected memory cells that are along the selected bit line (identified as "F" in FIG. 7A). Unselected bit lines each have 2.0 V applied thereto. This results in about 2.0 V across unselected memory cells that are along the selected word line (identified as "H" in FIG. 7A). The foregoing applied voltages cause about –2.0 V to be across unselected memory cells that are along both an unselected bit line and an unselected word line (identified as "U" in FIG. 7A).

Referring again to the example I-V curve in FIG. 3, it may be seen that with 6.3 V across the selected memory cell, the punch-through diode 204 will be conducting a large current. However, all of the unselected memory cells have about 2.3 V or less, resulting in their punch-through diodes 204 only conducting a very weak current. In some embodiments, more than one memory cell is programmed at a time. One technique for programming multiple memory cells is to program several memory cells that are on the same word line.

Figure 7B:
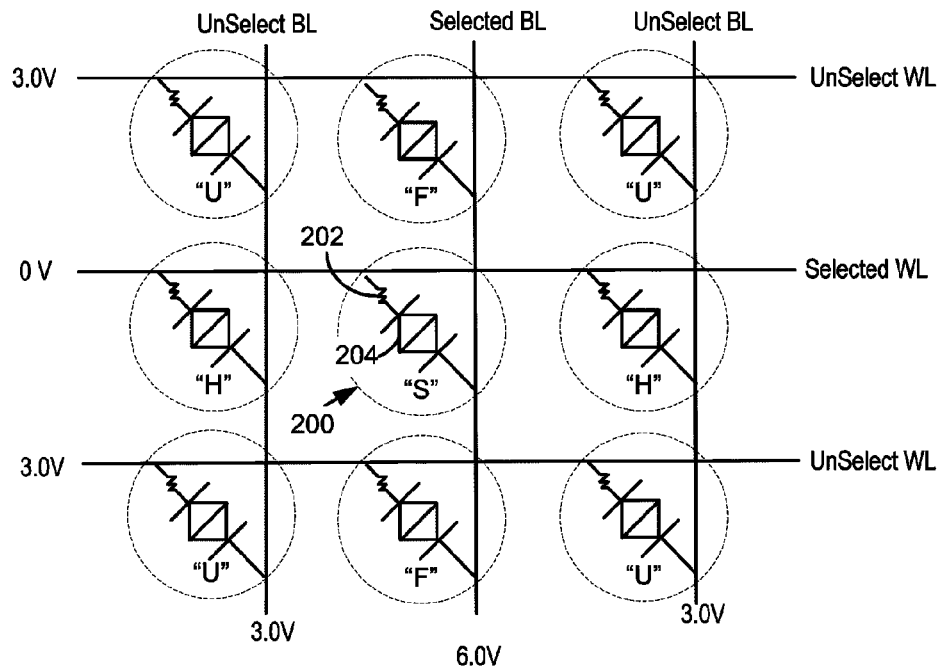
FIG. 7B depicts one embodiment of an array biasing scheme for programming memory cells.

Note that there may be many more "U" memory cells than the combined number of "H" and "F" memory cells. The number of "H" memory cells is about equal to the number of memory cells on the word line (or the number of bit lines). The number of "F" memory cells is about equal to the number of memory cells on the selected bit line (or the number of word lines). However, the number of "U" memory cells is about equal to the number of word lines multiplied by the number of bit lines. Therefore, the amount of power consumed by "U" memory cells may be more of a concern than the power consumed by the "H" and "F" memory cells. FIG. 7B depicts one embodiment of an array biasing scheme for programming memory cells 200 that results in about 0 V applied across "U" memory cells. Therefore, the scheme in FIG. 7B may consume less power than the biasing scheme of FIG. 7A.

Referring to FIG. 7B, 6.0 V is applied to the selected bit line (BL) while the selected word line (WL) is grounded, resulting in about 6.0 V across the selected memory cell (identified as "S" in FIG. 7B). At the same time, unselected word lines each have 3.0 V applied thereto. This results in about 3.0 V across unselected memory cells that are along the selected bit line (identified as "F" in FIG. 7B). At the same time, unselected bit lines each have 3.0 V applied thereto. This results in about 3.0 V across unselected memory cells that are along the selected word line (identified as "H" in FIG. 7B). The foregoing applied voltages cause about 0.0 V to be across unselected memory cells that are along both an unselected bit line and an unselected word line (identified as "U" in FIG. 7B).

Referring again to the example I-V curve, the 6.0 V across the selected memory cell should cause the punch-through diode 204 to conduct a strong current. However, all other memory cells have 3.0 V or less across them. Therefore, the punch-through diodes 204 in the unselected memory cells should conduct only a weak current. While the "F" and "H" memory cells may consume slightly more power than in the embodiment of FIG. 7A, there are many more "U" memory cells. Overall, the embodiment of FIG. 7B may consume less power when programming selected memory cells than the embodiment of FIG. 7A.

Referring back to the embodiment of FIG. 7A, different voltages are applied across the "F" memory cells than the "H" memory cells. In that case, the voltage across the "F" memory cells is slightly higher than the voltage across the "H" memory cells. However, in other embodiments, the voltage across the "H" memory cells is higher than the voltage across the "F" memory cells.

The following table summarizes some example biasing schemes for programming memory cells. In this table, the biasing is described relative to the voltage across the selected cell. Note that the sum of the voltages across the "F," "H," and "U" memory cells equals 100%, in these examples. The first row roughly summarizes the embodiment of FIG. 7A, and the second row roughly summarizes the embodiment of FIG. 7B. The third row and fourth rows describe yet other embodiments.

| Selected cell | unselected "F" cell | unselected "U" cell | unselected "H" cell |
|---|---|---|---|
| 100% | 36% | 32% | 32% |
| 100% | 50% | 0% | 50% |
| 100% | 40% | 10% | 50% |
| 100% | 32% | 32% | 36% |

Note that a wide variety of biasing schemes are possible by varying the percentage of bias that is applied across the "F," "H," and "U" memory cells. Also referring back to the examples of FIGS. 7A and 7B, the voltage applied to the selected bit line could be greater or less than shown. In this case, to keep the voltage percentages the same for the unselected memory cells, a suitable adjustment may be made to the other applied voltages. Also, the diode steering elements 204 of the memory cells 200 are depicted as NPN punch-through diodes in FIGS. 7A and 7B. However, PNP punch-through diodes could be used.

The voltages that are applied to bit lines and word lines to read a selected memory cell may cause some voltage to appear across unselected memory cells. In particular, there may be a voltage across the unselected "F" memory cells along the selected bit line. Therefore, the unselected "F" memory cells may conduct a current that depends on the state of the unselected memory cell, as well as the amount of voltage that is applied across. For at least the reason that the number of "F" memory cells that are SET (or RESET) can vary from bit line to bit line, the amount of current from all of the unselected "F" memory cells could vary from one bit line to the next.

Figure 8:
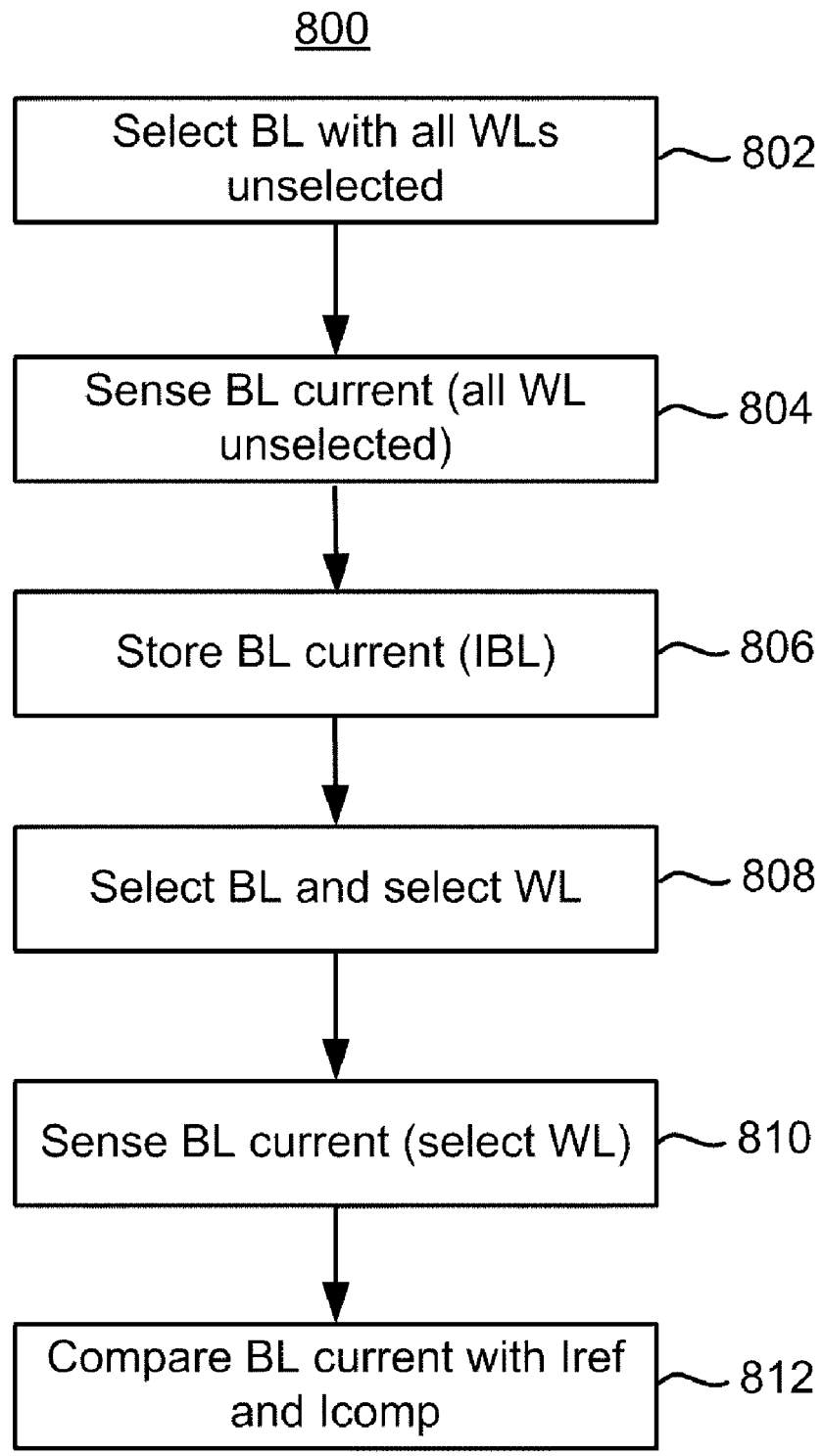
FIG. 8 depicts one embodiment of a process that compensates for current from unselected memory cells when reading memory cells.

FIG. 8 depicts one embodiment of a process 800 that compensates for this current when reading memory cells by first reading with all word lines unselected. In one embodiment, the auto-zero circuitry 491 of FIG. 6 is used to provide the compensation. For the sake of discussion, reading a memory cell 200 on a single bit line will be discussed. However, it will be understood that process 800 can be applied in parallel to read different memory cells 200 on different bit lines. In some embodiments, memory cells on all bit lines may be read in parallel.

In step 802, conditions are set up on word lines and bit lines for an initial read to determine a baseline conduction current of unselected memory cells 200 on a selected bit line. For example, a read select voltage (Vread) is applied to the selected bit line while an "unselect read word line voltage" is applied to all word lines. In one embodiment, the voltage that is applied to an unselected word line is about 70% of Vread. An "unselect read bit line voltage" is applied to the unselected bit line if there are any unselected bit lines. Note that in some embodiments all bit lines are read together, but that is not required. Also note that there are no selected word lines in step 802.

In step 804, the conduction current of the selected bit line is sensed. This conduction current reflects the conduction current of all unselected memory cells on the bit line and serves as a baseline conduction current. In step 806, a physical condition that represents the conduction current of the selected bit line is stored. In one embodiment, the circuit of FIG. 6 is used to sense the conduction current and to store a physical condition based thereon. When sensing the conduction current, the reference current Iref is shut off. Transistor 462 couples the selected bitline to Vsense node. Auto-zero mechanism 492 samples Vsense and then stores a physical condition that represents the conduction current of the unselected memory cells.

In step 808, appropriate voltages are applied to the selected bit line and word line to read the selected memory cell. In one embodiment, Vread is applied to the selected bit line and the selected word line is grounded. Appropriate voltages are also applied to the unselected bit lines and the unselected word lines. In one embodiment, 0.5*Vread is applied to the unselected bit lines and 0.7*Vread is applied to the unselected word lines.

In step 810, the conduction current of the selected bit line is sensed. Note that this will be the conduction current of the selected memory cell plus the conduction current of all of the unselected memory cells. In step 812, the conduction current of the selected bit line is compared to a reference current ($I_{REF}$) while adjusting for the conduction current of the unselected memory cells. Referring now to FIG. 6, the reference current ($I_{REF}$) is turned on when reading the selected memory cell. Auto-zero mechanism 492 provides a compensation current ($I_{COMP}$) to the positive input of the comparator 466. The magnitude of the compensation current ($I_{COMP}$) represents the conduction current of the unselected memory cells. Therefore, the conduction current of the unselected memory cells is subtracted from the conduction current of the selected bit line. The output of the comparator 466 is provided to data latch 468, which may record a value of "1" or "0," depending on the comparison.

Figure 9:
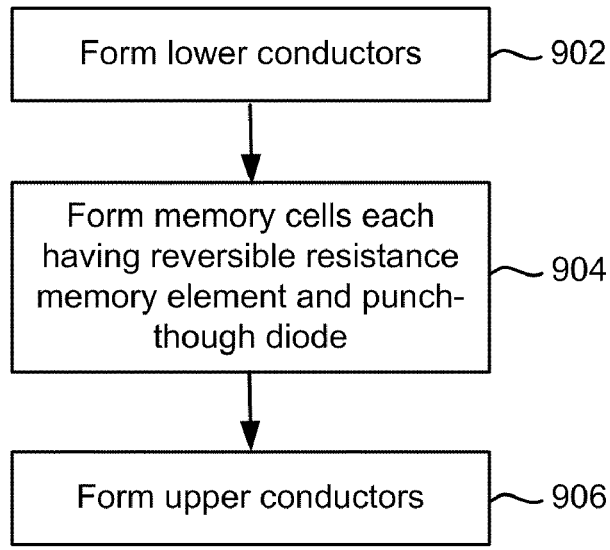
FIG. 9 shows a process of one embodiment of forming a memory array that has punch-through diodes as steering elements.

FIG. 9 shows a process 900 of one embodiment of forming a memory array that has punch-through diodes 204 as steering elements. Process 900 may be used to form an array such as the memory arrays 214 depicted in FIG. 4B or 4C.

Figure 10:
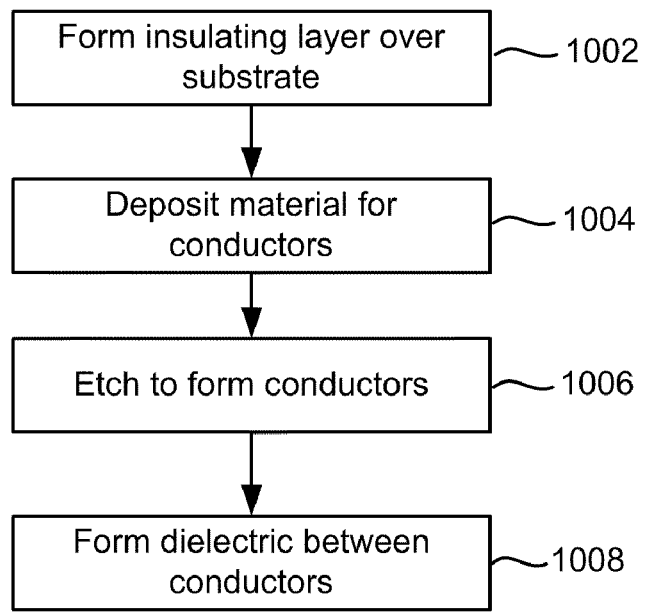
FIG. 10 depicts one embodiment of a process of forming bottom conductors in a memory array.

In step 902, conductors 206, which are the bottom-most conductors of the memory array 214, are formed over a substrate. FIG. 10 depict further details of a process for forming the bottom conductors. FIGS. 11A-11B depict results of forming bottom conductors.

Figure 11C:
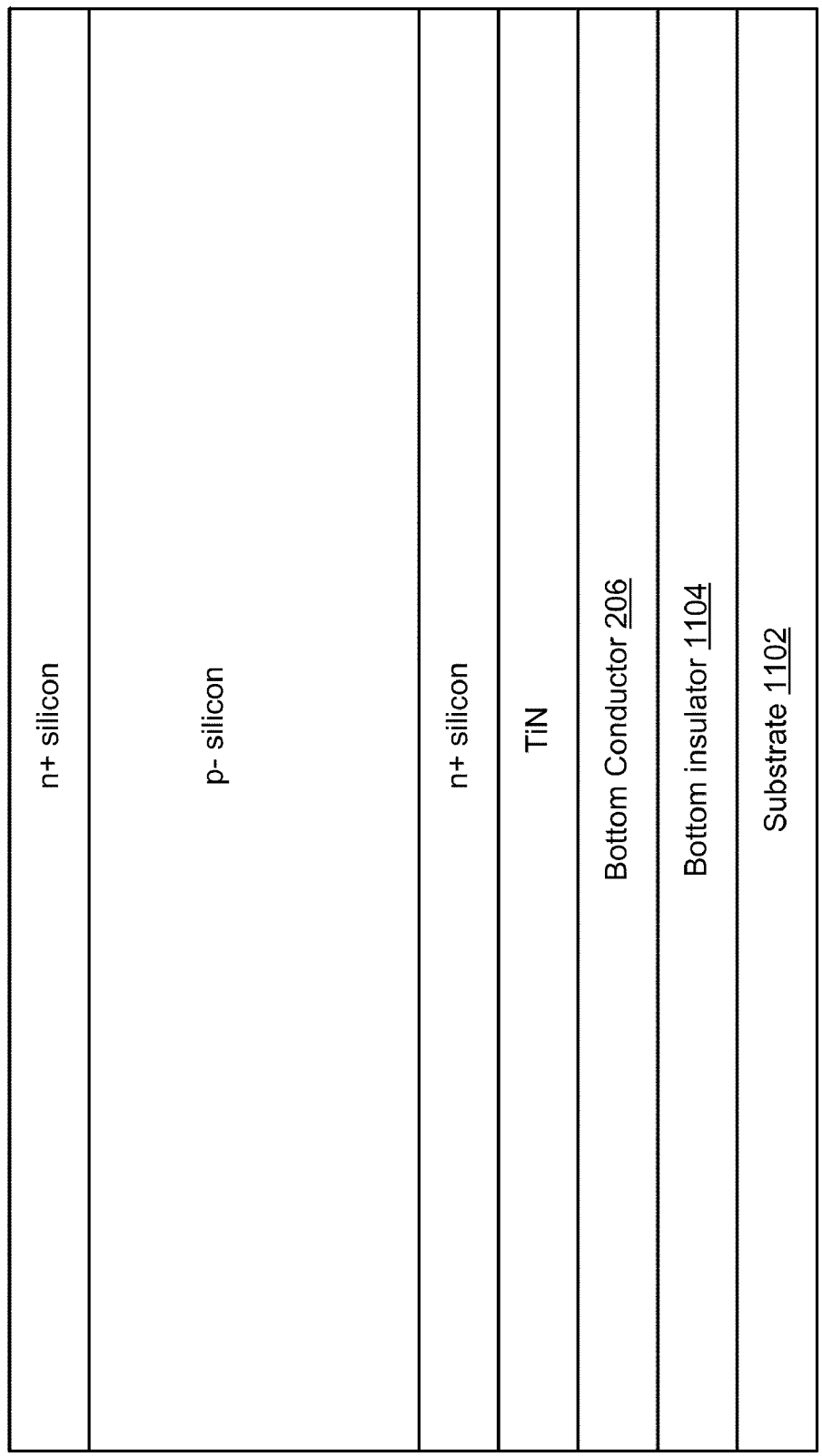
Figure 11E:
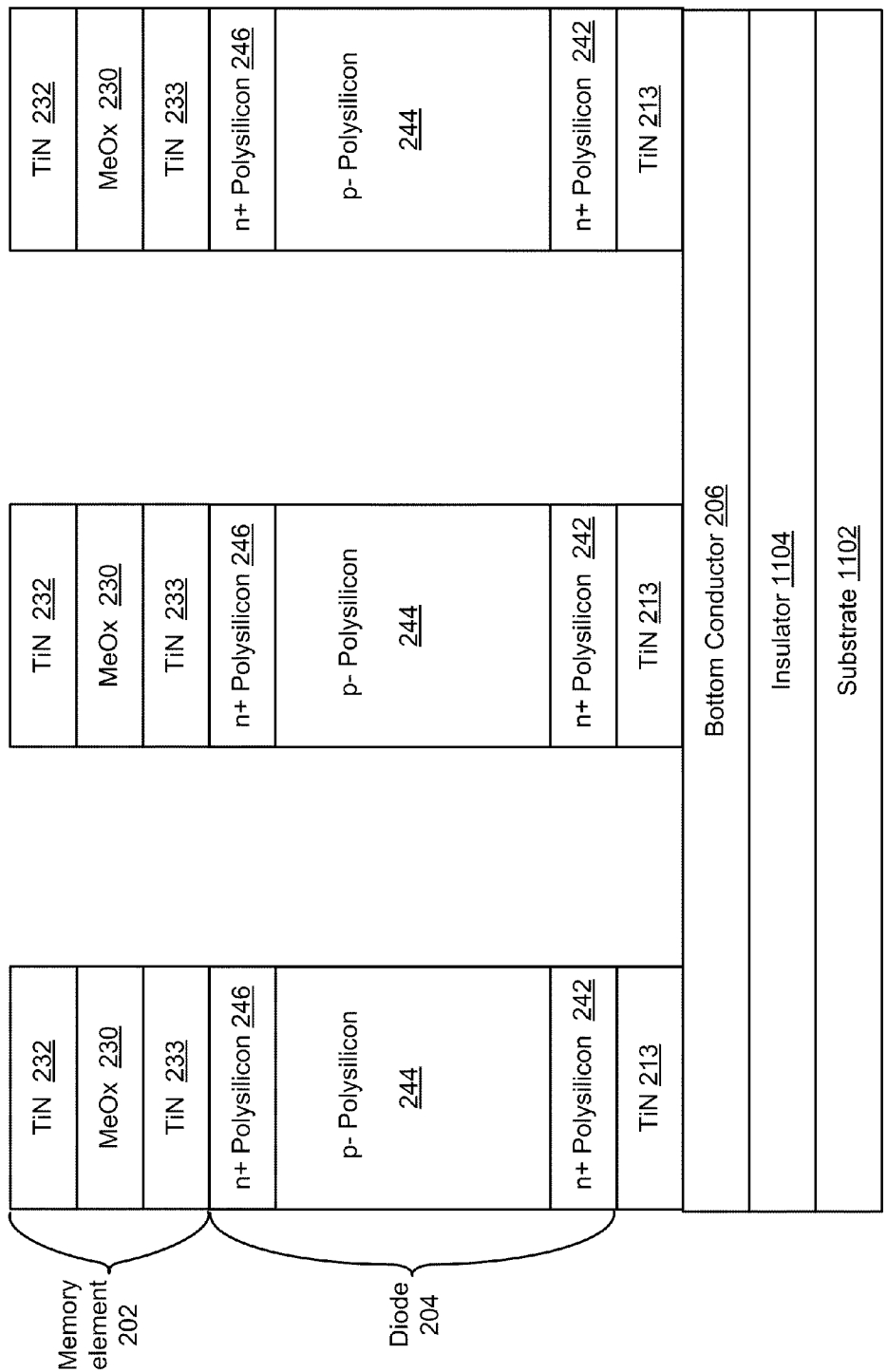
Figure 11F:
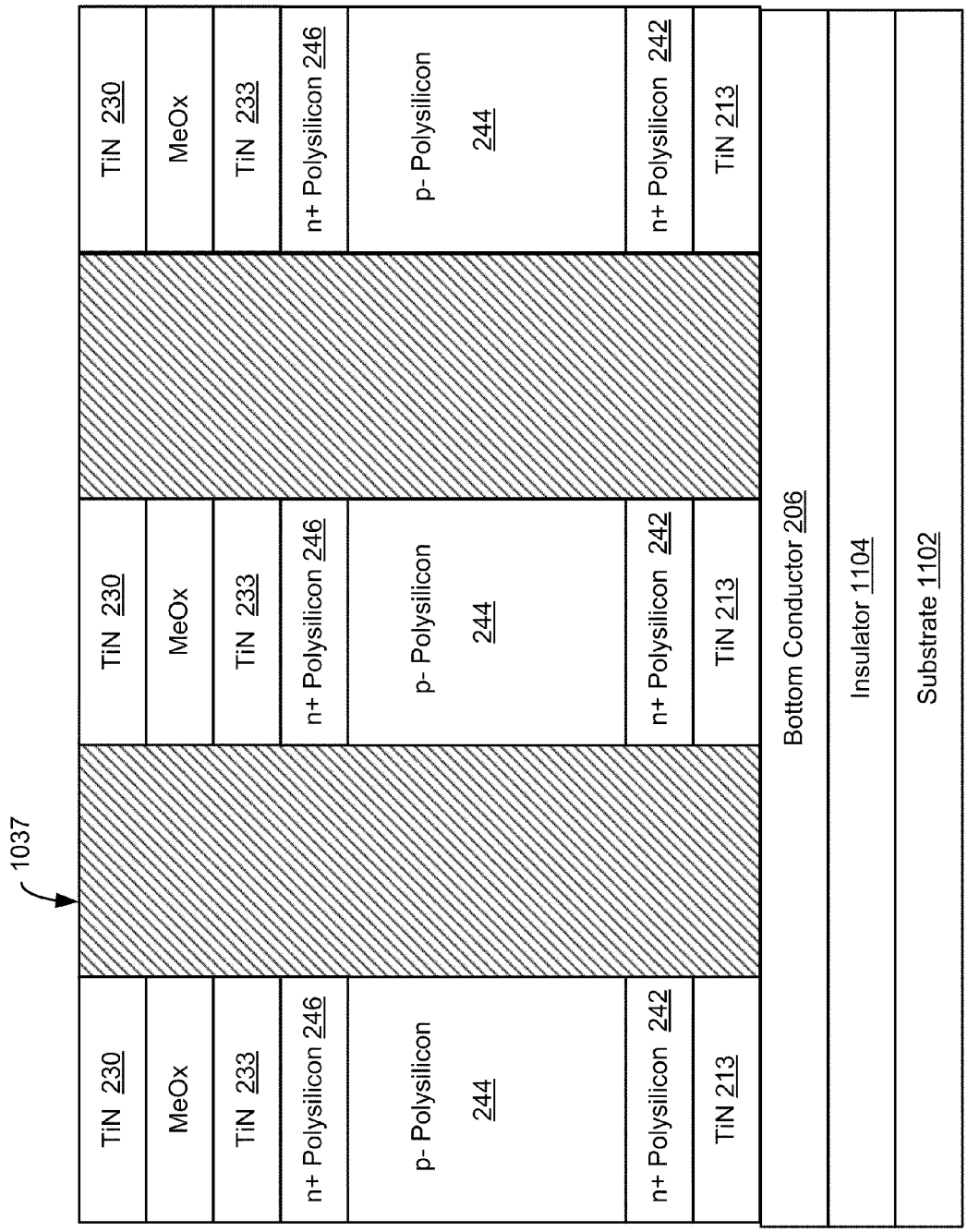
Figure 12:
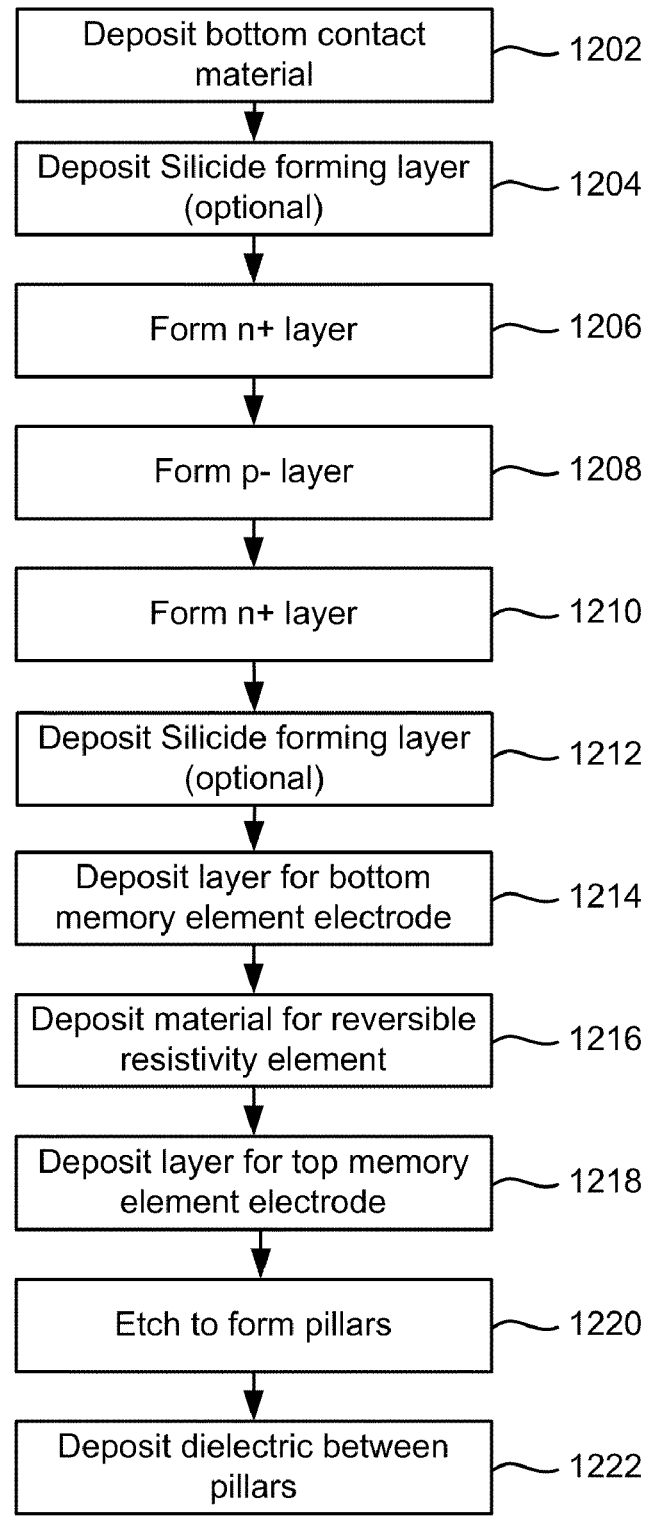
FIG. 12 depicts one embodiment of a process of forming memory cells having punch-through diodes in electrical series with reversible resistivity-switching elements.

In step 904, memory cells 200 that have reversible resistance memory elements 102 and punch-through diodes 204 as steering elements are formed over the bottom conductors 206. FIG. 12 depicts one embodiment of a process 1200 for forming memory cells 200. FIGS. 11C-11F depict the memory cells 200 at various stages of formation using process 1200.

Note that process 1200 is one example of how to form the memory cells 200 within a memory array. However, other techniques may be used to form the memory cells.

In step 906, top conductors 208 are formed over the memory cells 200. The result is that each memory cell 200 is coupled between one of the bottom conductors 206 and one of the top conductors 208. After step 906 a memory array such as depicted in FIG. 4B is formed. If desired an additional layer can be formed such as depicted in FIG. 4C.

Furthermore, a structure such as depicted in FIG. 4D can be formed by forming an additional layer 220 of memory cells 200 over the top conductors 208. Then another layer of conductors 206 may be formed of the memory cells 200. In this case, the middle conductors 208 serve as conductors for memory cells at two different levels 218, 220 of the memory array 214.

FIG. 10 depicts one embodiment of a process 1000 of forming bottom conductors 206 in a memory array. Process 1000 is one implementation of step 902 of process 900. Formation of the memory array may begin with a substrate. The substrate can be any semiconducting substrate known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein. For example, the substrate may include circuits that are electrically connected to the conductors 206, 208 in order to read and program the memory array. In step 1002, an insulating layer is formed over substrate. The insulating layer can be silicon oxide, silicon nitride, or any other suitable insulating material.

In step 1004, material for first conductors 206 is deposited over the insulator. An adhesion layer may be included between the insulating layer and the conducting layer to help the conducting layer adhere to the insulating layer. If the overlying conducting layer is tungsten, titanium nitride may be used as an adhesion layer. The conducting layer may comprise any conducting material known in the art, such as tungsten, or other materials, including tantalum, titanium, copper, cobalt, or alloys thereof.

Once all the layers that will form the conductor rails 206 have been deposited, the layers are patterned and etched using any suitable masking and etching process to form substantially parallel, substantially coplanar conductors 206, in step 1006. In one embodiment, photoresist is deposited, patterned by photolithography and the layers etched, and then the photoresist removed using standard process techniques.

Next, in step 1008, a dielectric material is deposited over and between conductors 206. The dielectric material can be any known electrically insulating material, such as silicon oxide, silicon nitride, or silicon oxynitride. In one embodiment, silicon dioxide deposited by a high-density plasma method is used as dielectric material. Excess dielectric material on top of conductor rails 206 may be removed, exposing the tops of conductors 206 separated by dielectric material, and leaving a substantially planar surface. This removal of dielectric overfill to form the planar surface can be performed by any process known in the art, such as chemical mechanical polish (CMP) or planarization etchback. In an alternative embodiment, conductors 206 could be formed by a Damascene method. FIGS. 11A and 11B depict results after process 1000. FIG. 11A shows bottom conductors 206 residing over a substrate 1102 and bottom insulator 1104 with dielectric 1106 between the bottom conductors 206. FIG. 11B shows a cross section taken along line A-A' of FIG. 11A.

FIG. 12 depicts one embodiment of a process 1200 of forming memory cells 200 having punch-through diodes 204 in electrical series with reversible resistivity-switching elements 202. Process 1200 provides details for step 904 of FIG.

9. Process 1200 may be performed after process 1000 is used to form bottom conductors 206. FIG. 11C-11F show results after various formation steps of process 1200. FIGS. 11C-11F show a cross section of the memory array from a perspective that is perpendicular to cross section of FIG. 11A. Specifically, FIGS. 11C-11F depict formation of additional layers on top of the structure of FIG. 11B.

In step 1202, a layer of material that will be used for diode electrode 213 is deposited. Step 1202 may include depositing a layer of TiN over the conductors 206 and the dielectric 1106 that resides between the conductors 206. However, diode electrode 213 can be formed from another material.

In optional step 1204, a layer of a silicide forming material is deposited over the TiN layer. In steps 1206, 1208, and 1210, a layer of semiconductor material that will be patterned into pillars for the punch-through diodes 204 is deposited. In one embodiment, the semiconductor material is silicon. For purposes of discussion, an example in which the heavily-doped regions 242, 246 are doped with an n-type of impurity and the lightly-doped region 244 is doped with a p-type of impurity will be discussed. It will be understood that the doping may be reversed. In step 1206, an n+ layer is formed. In step 1208, a p− layer is formed. In step 1210, another n+ layer is formed.

In one embodiment, in situ doping is performed while depositing the silicon in order to form layers of differently doped regions. For example, during appropriate times during deposition of the silicon, a gas providing n-type or p-type dopant atoms is provided. However, in situ doping is not required. In one embodiment, after depositing a layer of silicon doping is performed. For example, an ion implant may be performed after depositing a layer of silicon to form the n+ layer. After depositing another silicon layer, another ion implement can be performed to form the p− layer. Then, after depositing another silicon layer, another ion implement can be performed to form the upper n+ layer FIG. 11C depicts results after step 1210 for an example in which the silicide material was not deposited in step 1204.

In optional step 1212, a layer of a silicide forming material is deposited over the n+ layer. Note that after depositing the silicide forming material, a thermal anneal may be performed to form a silicide with the silicon that is used to form the diodes 204. As an example, a rapid thermal anneal (RTA) between 550-650 degrees Celsius may be performed for about 60 seconds.

In step 1214, material for the bottom electrode 234 for the memory cell is deposited. The bottom electrode 234 may be formed from TiN. The bottom electrode 234 can be deposited using a variety of techniques including, but not limited to, chemical vapor deposition (CVD), physical vapor deposition (PVD), atomic layer deposition (ALD), and sputtering. The bottom electrode 234 forms an electrical connection to the punch-through diode 204.

In step 1216, material for a reversible resistivity-switching elements 202 is deposited. Many different types of materials can be deposited in this step. In one embodiment, the reversible resistivity-switching elements 202 are a metal oxide (MeO$_x$). The MeO$_x$ can be deposited using a variety of techniques including, but not limited to, chemical vapor deposition (CVD), physical vapor deposition (PVD), atomic layer deposition (ALD), and sputtering. In one embodiment, the reversible resistivity-switching elements 202 is Ge$_2$Sb$_2$Te$_5$ (GST). GST has a property of reversible phase change from crystalline to amorphous-allowing two levels per cell. However, quasi-amorphous and quasi-crystalline phases may also be used to allow additional levels per cell with GST. In some embodiments, the reversible resistivity-switching elements 202 is formed from a carbon material. A reversible resistivity-switching elements 202 that is formed from carbon may comprise any combination of amorphous and graphitic carbon. In one embodiment, the reversible resistivity-switching elements 202 is a carbon nanotube (CNT).

In step 1218, material for a top electrode 232 is deposited. The top electrode 232 may be formed from a wide variety of materials including, but not limited to, platinum, TiN, and TaN. The top electrode 232 can be deposited using a variety of techniques including, but not limited to, chemical vapor deposition (CVD), physical vapor deposition (PVD), atomic layer deposition (ALD), and sputtering. FIG. 11D depicts results after step 1218 for an example in which the silicide material was not deposited in steps 1204 or 1212.

In step 1220, pillars are formed out of the material deposited in steps 1202-1218. Pillars can be formed using any suitable masking and etching process. For example, photoresist can be deposited, patterned using standard photolithography techniques, and etched. Then, the photoresist may be removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask. In some embodiments, the pillars have about the same pitch and about the same width as conductors 206 below, such that each pillar is formed on top of a conductor 206. Some misalignment can be tolerated. FIG. 11E depicts results after step 1220 in which each pillar corresponds to one memory cell 200 having a punch-through diode 204 in series with a memory element 202.

In step 1222, dielectric material 1037 is deposited over and between the semiconductor pillars, filling the gaps between them. Dielectric material 1037 can be any known electrically insulating material, such as silicon oxide, silicon nitride, or silicon oxynitride. In one embodiment, silicon dioxide is used as the insulating material. The dielectric material on top of pillars is removed, exposing the tops of pillars separated by dielectric material, and leaving a substantially planar surface. This removal of dielectric overfill can be performed by any process known in the art, such as CMP or etchback. FIG. 11F depicts results after step 1222.

Note that in addition to the optional thermal anneal that is used to form the silicide, there may be one or more other thermal anneals. For example, there may be a thermal anneal to crystallize the polysilicon and to activate the dopants. In one embodiment, Rapid Thermal Anneal (RTA) is done for 60 seconds at 700-750 degrees Celsius. However, other temperatures and times could be used. Note that if a memory device with multiple layers of diodes is constructed there might be multiple anneals to form the silicides (e.g., there might be a separate anneal to form each silicide region), but only one anneal to crystallize the polysilicon and activate the dopants.

The process 1200 of FIG. 12 is just one example of forming punch-through diodes 204 that serve as steering elements in a cross-point array. Also, certain formation steps in process 1200 could be altered. For example, the punch-through diode 204 could be formed above the memory element 202. Also, the materials used to describe formation of the memory array are for purposes of illustration and are not intended to be limiting.

Figure 11G:
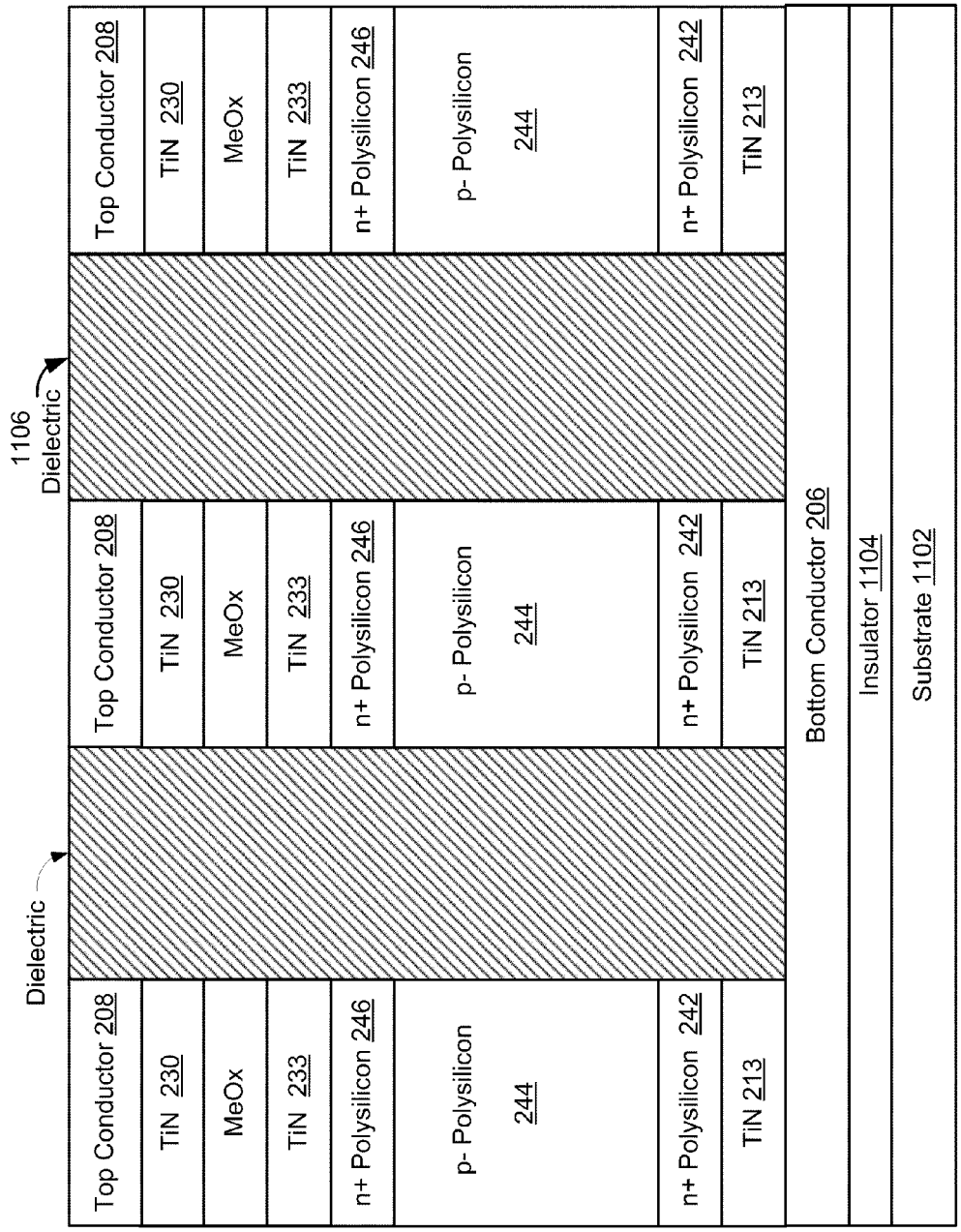
FIG. 11G depict results of forming a memory array using the process of FIG. 10.

After forming the memory cells 200, upper conductors 208 are formed. Formation of upper conductors 208 may include depositing material for upper conductors over the structure of FIG. 11F. The conducting layer may comprise any conducting material known in the art, such as tungsten, or other materials, including tantalum, titanium, copper, cobalt, or alloys thereof. The material is then patterned and etched using any suitable masking and etching process to form substantially parallel, substantially coplanar conductors 208. In one embodiment, photoresist is deposited, patterned by photolithography and the layers etched, and then the photoresist removed using standard process techniques. A dielectric material 1106 may be deposited over and between conductors 208. The dielectric material can be any known electrically insulating material, such as silicon oxide, silicon nitride, or silicon oxynitride. In one embodiment, silicon dioxide deposited by a high-density plasma method is used as dielectric material. Excess dielectric material on top of conductor rails 208 may be removed, exposing the tops of conductors 208 separated by dielectric material, and leaving a substantially planar surface. This removal of dielectric overfill to form the planar surface can be performed by any process known in the art, such as chemical mechanical polish (CMP) or planarization etchback. FIG. 11G depict results after forming the top conductors 208.

Figure 13:
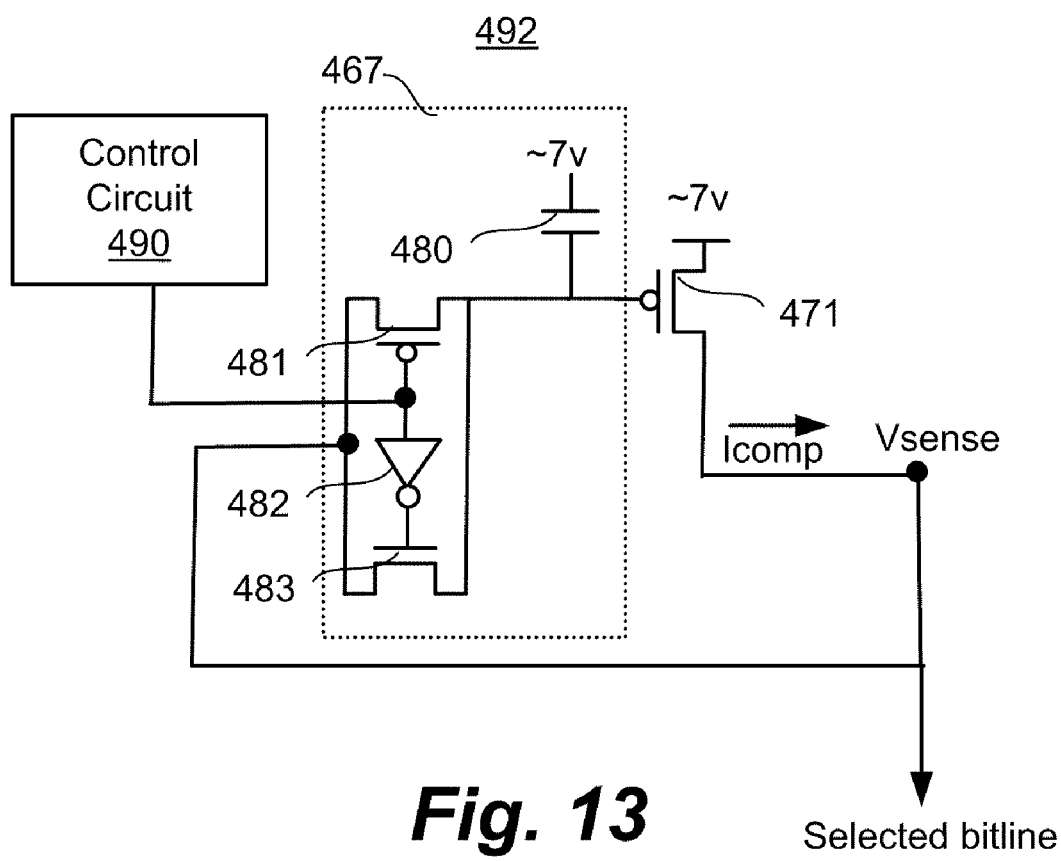
FIG. 13 depicts one embodiment of an auto-zero circuit.

FIG. 13 depicts one embodiment of an auto-zero mechanism 492 that compensates for current from non-selected memory elements during a read of a selected memory element. The auto-zero mechanism 492 of FIG. 13 may be used in the circuit of FIG. 6. The auto-zero mechanism 492 includes sample and hold 467, control circuit 490, and transistor 471. The sample and hold circuit 467 is connected to the Vsense node and operates to sample and hold a physical condition that represents the current of a sensed bit line connected to Vsense node. The sample and hold circuit 467 includes capacitor 480, transistor 481, inverter 482, and transistor 483. Sample and hold circuit 467 is also connected to transistor 471, which operates to mirror the bit line current that was sampled. During the auto zero operation the control circuit 490 turns on the sample and hold devices 481 and 483. During the auto-zero operation the bit line current from all cells on the selected bit line pulls down Vsense and the voltage on capacitor 480 until an equilibrium voltage is reached on Vsense, i.e. when the current through device 471 Icomp matches the current from the selected bit line. During the data sensing operation the control circuit 490 turns off sample and hold devices 481 and 483 and transistor 471 outputs $I_{COMP}$, which supplies the current that flowed during auto-zero operation and therefore compensates for current from non-selected memory elements.

Figure 14:
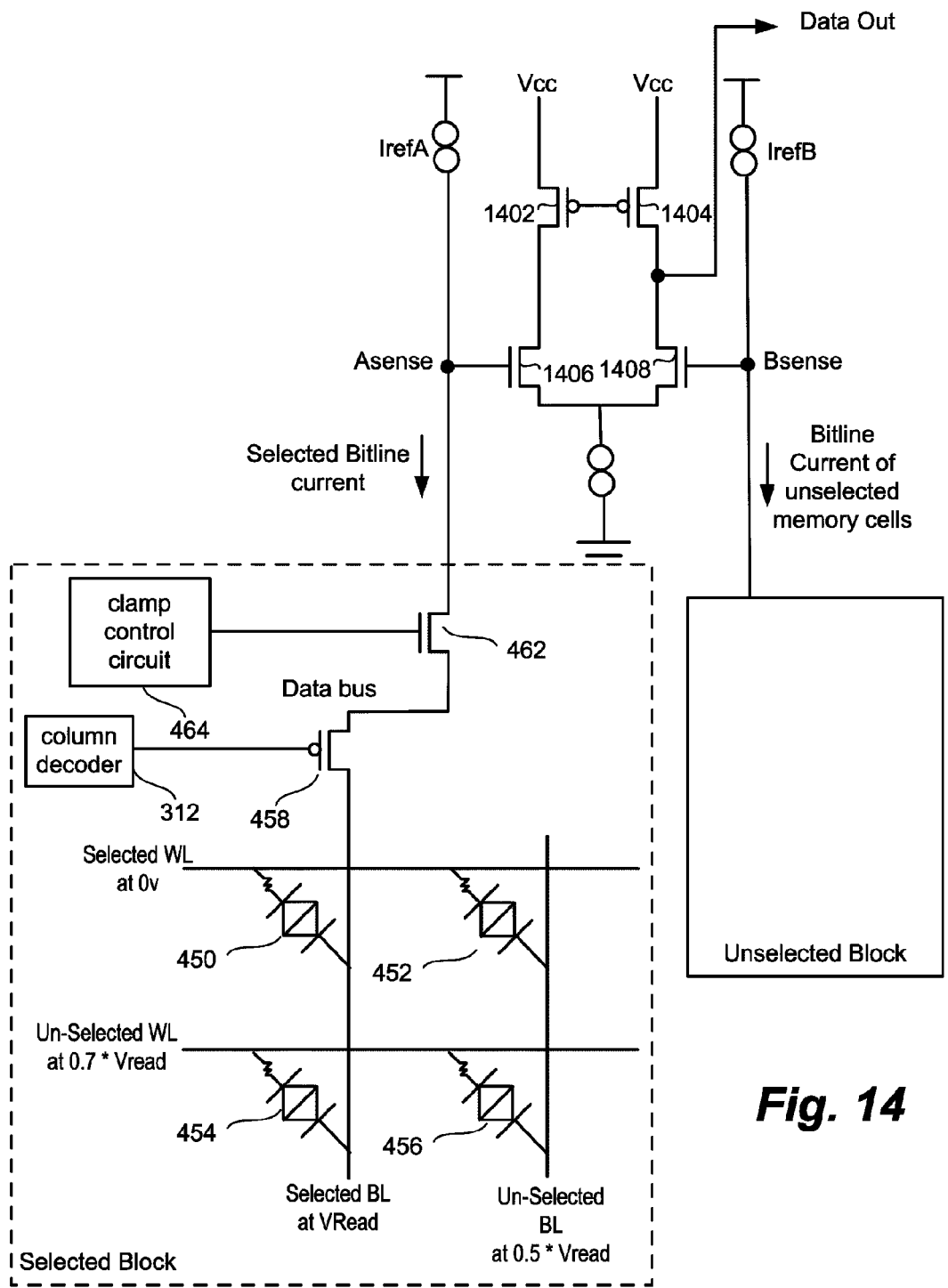
FIG. 14 depicts one embodiment of a differential sense circuit for reading memory cells.

FIG. 14 depicts one embodiment of a circuit that compensates for the current from unselected memory cells when reading a selected memory cell. The circuit of FIG. 14 is an alternative for reading memory cells to the circuit of FIG. 6. The circuit compares a bit line current from a selected memory cell in one block with a bit line current from an "unselected block." The word lines for all of the memory cells on the bit line in the unselected block are unselected. The circuit outputs the signal "Data Out" based on the comparison. The circuit includes differential sensing transistors 1402, 1404, 1406, 1408, as well as IrefA and IrefB. Details of circuit elements in the selected block have already been discussed with respect to the circuit of FIG. 6.

When reading the selected memory cell, a bit line select voltage (e.g., Vread) is applied to the selected bit line, a word line select voltage (e.g., 0V) is applied to the selected word line. Other word lines in the selected block are unselected. An example, voltage for unselected word lines is 0.7*Vread. Other bit lines in the selected block may be selected or unselected. An example, voltage for unselected bit lines is 0.5*Vread. The gate of transistor 1406 is coupled to the selected bit line by the transistor 462. Current is pulled by the selected memory cell through transistor 462 from the $A_{SENSE}$ node. The $A_{SENSE}$ node also receives a reference current $I_{REFA}$. The $A_{SENSE}$ node moves corresponding to the current difference between the selected bit line current and the reference current $I_{REFA}$. Note that the selected bit line current includes current from the selected memory cell and may also include some current from unselected memory cells.

At the same time, transistor 1408 is coupled to the bit line in the unselected block to sense the conduction current for unselected memory cells. When sensing the current of the unselected memory cells, a bit line select voltage is applied to the bit line being sensed in the unselected block. However, none of the word lines are selected. That is, an unselect word line voltage is applied to all of the word lines in the unselected block. Other bit lines may be selected or unselected. Current is pulled by the unselected memory cells from the $B_{SENSE}$ node. The $B_{SENSE}$ node also receives a reference current $I_{REFB}$. The $B_{SENSE}$ node moves corresponding to the current difference between the bit line current for unselected memory cells and the reference current $I_{REFB}$.

If the selected memory cell is SET, then it should conduct a strong current. This current should be much stronger than the current from the bit line in the unselected block. Consequently, this should pull Asense node lower than Bsense node. If the selected memory cell is RESET, then it should conduct a relatively weak current. This current may be similar in magnitude to the current from the bit line in the unselected block. Note that the relative magnitudes of IrefA and IrefB can be selected such that when the selected memory cell is RESET Bsense node will be pulled lower than Asense node. The Data Out node moves high or low depending on the relative magnitudes at Asense node and Bsense node. Thus, the Data Out signal definitively indicates whether the selected memory cell is SET or RESET.

In many of the circuit diagrams described above, the depicted circuits can be replaced by the dual of these circuits where NMOS and PMOS device types are exchanged and positive voltages are exchanged with negative voltages.

One embodiment disclosed herein includes a non-volatile storage device comprising a first plurality of conductors, a second plurality of conductors, and a plurality of memory cells. Each of the memory cells resides between one pair of the conductors. Each of the memory cells includes a reversible resistivity-switching element and a diode in series with the reversible resistivity-switching element. The diode includes a first region of a semiconductor material that is heavily-doped with an impurity having a first conductivity, a second region of a semiconductor material that is lightly-doped with an impurity having a second conductivity, and a third region of a semiconductor material that is heavily-doped with an impurity having the first conductivity. The second region resides between the first region and the third region. The diode may be a punch-through diode. In one embodiment, the diode has a symmetrical current-voltage relationship.

One embodiment includes a method of forming a non-volatile storage device comprising forming a first plurality of conductors that extend in a first direction, forming a second plurality of conductors that extend in a second direction that is substantially parallel to the first direction, and forming a plurality of memory cells. Each of the memory cells resides between one pair of the pairs of conductors. Forming the memory cells includes forming a reversible resistivity-switching element, and forming a punch-through diode in series with the reversible resistivity-switching element.

One embodiment includes a non-volatile storage device comprising a plurality of bit lines that extend in a first direction, a plurality of word lines that extend in a second direction perpendicular to the first direction, a plurality of memory cells, and one or more management circuits in communication with the bit lines and the word lines. Each of the memory cells resides between one bit line and on word line which form a pair. Each of the memory cells includes a reversible resistivity-switching element and a punch-through diode in series with the reversible resistivity-switching element. The one or more management circuits apply a first voltage difference between a selected bit line and a selected word line to cause a selected reversible resistivity-switching element to switch from a first resistance state to a second resistance state, The one or more management circuits apply a second voltage difference between the selected bit line and the selected word line to cause the selected reversible resistivity-switching element to switch from the second resistance state to the first resistance state. The second voltage has the opposite polarity as the first voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device comprising:
a first plurality of conductors;
a second plurality of conductors, one of the first conductors and one of the second conductors define a pair of conductors;
a plurality of memory cells, each of the memory cells residing between one pair of the pairs of conductors, each of the memory cells including:
a reversible resistivity-switching element; and
a diode in series with the reversible resistivity-switching element, the diode including a first region of a semiconductor material that is heavily-doped with an impurity having a first conductivity, the diode including a second region of a semiconductor material that is lightly-doped with an impurity having a second conductivity, the diode including a third region of a semiconductor material that is heavily-doped with an impurity having the first conductivity, the second region resides between the first region and the third region, the doping profile in the first region and the third region is graded with the doping concentration being lowest near the second region.

2. The non-volatile storage device of claim 1, wherein the diode has a symmetrical current-voltage relationship.

3. The non-volatile storage device of claim 1, wherein the first region has a first doping concentration, the third region has a second doping concentration that is approximately the same as the first doping concentration.

4. The non-volatile storage device of claim 1, wherein the first region has a first doping concentration, the second region has a second doping concentration, the third region has a third doping concentration, the first doping concentration and the third doping concentration are each at least 1000 times greater than the second doping concentration.

5. The non-volatile storage device of claim 1, wherein the semiconductor material in the first region, the semiconductor material in the second region, and the semiconductor material in the third region each include one or more of silicon and germanium.

6. The non-volatile storage device of claim 1, wherein the semiconductor material in the first region, the semiconductor material in the second region, and the semiconductor material in the third region each include silicon.

7. The non-volatile storage device of claim 1, wherein the reversible resistivity-switching element includes a transition metal oxide.

8. The non-volatile storage device of claim 1, wherein the reversible resistivity-switching element has an upper electrode and a lower electrode, the upper electrode includes titanium nitride, the lower electrode includes titanium nitride.

9. The non-volatile storage device of claim 1, wherein the memory cell further includes a silicide region between the diode and the reversible resistivity-switching element.

10. The non-volatile storage device of claim 9, wherein the memory cell further includes an electrical contact to the diode and a silicide region between the diode and the electrical contact.

11. The non-volatile storage device of claim 1, further comprising one or more management circuits in communication with the bit lines and the word lines, the one or more management circuits read, SET and RESET a selected memory cell, the second region of the diode of the selected memory cell is depleted when being read, SET, or RESET.

12. The non-volatile storage device of claim 1, wherein the diode further comprises a thin layer between the first region and the second region to prevent migration of dopant from the heavily-doped first region to the lightly-doped second region.

13. The non-volatile storage device of claim 12, wherein the thin layer is germanium.

14. The non-volatile storage device of claim 13, wherein the thin layer is a silicon-germanium alloy with at least 10% germanium.

15. The non-volatile storage device of claim 1, wherein the second region is thicker than both the first region and the third region.

16. The non-volatile storage device of claim 1, wherein the diode is a P+/N−/P+ punch through diode.

17. The non-volatile storage device of claim 1, wherein the diode is an N+/P−/N+ punch through diode.

18. The non-volatile storage device of claim 1, wherein the first region and the third region each have a doping concentration of about $1.0 \times 10^{21}/cm^3$, and the second region has a doping concentration of about $7.0 \times 10^{17}/cm^3$.

19. The non-volatile storage device of claim 1, wherein the doping concentration in first region and the third region is about $1.0 \times 10^{18}/cm^3$ near the second region gradually increasing to about $1.0 \times 10^{21}/cm^3$ away from the second region.

20. A non-volatile storage device comprising:
a first plurality of conductors;
a second plurality of conductors, one of the first conductors and one of the second conductors define a pair of conductors;
a plurality of memory cells, each of the memory cells residing between one pair of the pairs of conductors, each of the memory cells including:
a reversible resistivity-switching element; and
a punch through diode in series with the reversible resistivity-switching element, the diode having a heavily doped first semiconductor region, a lightly doped second semiconductor region, and a heavily doped third semiconductor region, the second semiconductor region between the first semiconductor region and third semiconductor region, the doping profile in the first semiconductor region and the third semiconductor region is graded with the doping concentration being lowest near the second semiconductor region.

* * * * *